US012813133B2

(12) United States Patent
Lee et al.

(10) Patent No.: US 12,813,133 B2
(45) Date of Patent: Nov. 24, 2026

(54) DISPLAY DEVICE AND METHOD OF MANUFACTURING THE SAME

(71) Applicant: Samsung Display Co., Ltd., Yongin-Si (KR)

(72) Inventors: Seung-Kyu Lee, Yongin-si (KR); Yongsik Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 614 days.

(21) Appl. No.: 18/136,878

(22) Filed: Apr. 20, 2023

(65) Prior Publication Data

US 2024/0074288 A1 Feb. 29, 2024

(30) Foreign Application Priority Data

Aug. 25, 2022 (KR) ........................ 10-2022-0106617

(51) Int. Cl.

| | |
|---|---|
| ***H10K 59/80*** | (2023.01) |
| ***H10K 59/121*** | (2023.01) |
| ***H10K 59/131*** | (2023.01) |
| ***H10K 71/16*** | (2023.01) |
| ***H10K 71/20*** | (2023.01) |
| *H10K 102/00* | (2023.01) |

(52) U.S. Cl.

CPC ....... *H10K 59/873* (2023.02); *H10K 59/1213* (2023.02); *H10K 59/131* (2023.02); *H10K 71/166* (2023.02); *H10K 71/233* (2023.02); *H10K 2102/311* (2023.02)

(58) Field of Classification Search

None

See application file for complete search history.

(56) References Cited

U.S. PATENT DOCUMENTS

| | | | | |
|---|---|---|---|---|
| 6,866,917 | B2 | 3/2005 | Song | |
| 8,329,486 | B2 | 12/2012 | Lee et al. | |
| 9,013,458 | B2 | 4/2015 | Cho et al. | |
| 9,893,092 | B2 | 2/2018 | Park et al. | |
| 11,482,580 | B2 | 10/2022 | Song et al. | |
| 2008/0224599 | A1 * | 9/2008 | Kim ..................... | H10K 59/124 445/24 |
| 2015/0036299 | A1 * | 2/2015 | Namkung ......... | G02F 1/133345 361/749 |
| 2019/0355799 | A1 | 11/2019 | Jeong et al. | |
| 2022/0309974 | A1 | 9/2022 | Park et al. | |

FOREIGN PATENT DOCUMENTS

| | | | |
|---|---|---|---|
| KR | 10-2002-0059956 | A | 7/2002 |
| KR | 10-2010-0050292 | A | 5/2010 |
| KR | 10-2016-0120389 | A | 10/2016 |
| KR | 10-2019-0132603 | A | 11/2019 |
| KR | 10-2081932 | B1 | 4/2020 |
| KR | 10-2021-0008977 | A | 1/2021 |
| KR | 10-2021-0084733 | A | 7/2021 |

* cited by examiner

*Primary Examiner* — Kyoung Lee

(74) *Attorney, Agent, or Firm* — Innovation Counsel LLP

(57) ABSTRACT

Provided is a display device comprising a substrate including a pixel area and a non-pixel area adjacent to the pixel area, an inorganic layer disposed on the substrate and having a through hole overlapping the non-pixel area, a light emitting element disposed in the pixel area on the inorganic layer, and an organic layer filing the through hole and having an upper surface positioned at substantially a same level as an upper surface of the inorganic insulating layer based on a surface of the substrate.

19 Claims, 20 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2022-0106617, filed on Aug. 25, 2022, which is hereby incorporated by reference for all purposes as if fully set forth herein.

BACKGROUND

1. Field

The present disclosure generally relates to a display device and method of manufacturing the same. More particularly, the present disclosure relates to a display device capable of preventing crack propagation and method of manufacturing the same.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

Recently, a flexible display device that can be deformed into various shapes has been developed. Unlike a flat panel display, a flexible display device may be folded, bent, or rolled like paper. The flexible display device may be easy to carry and may improve user convenience. Recently, among flexible display devices, a foldable display device is in the limelight. The foldable display device may be repeatedly folded and unfolded.

SUMMARY

Embodiments provide a display device that prevents crack propagation.

Embodiments provide a method of manufacturing the display device.

A display device according to embodiments of the present disclosure may include a substrate including a pixel area and a non-pixel area adjacent to the pixel area, an inorganic layer disposed on the substrate, a through hole defined in the organic layer and disposed in the non-pixel area, a light emitting element disposed in the pixel area on the inorganic layer, and an organic layer filing the through hole and having an upper surface positioned at substantially a same level as an upper surface of the inorganic insulating layer based on a surface of the substrate.

In an embodiment, the through hole may expose at least a portion of an upper surface of the substrate.

In an embodiment, the display device may further include a driving transistor disposed in the pixel area on the substrate and a switching transistor disposed in the pixel area on the substrate and including a semiconductor material different from a semiconductor material include in the driving transistor.

In an embodiment, the driving transistor may include a first active pattern disposed on the substrate and having amorphous silicon or polycrystalline silicon.

In an embodiment, the switching transistor may include a second active pattern disposed on the substrate and having a metal oxide semiconductor.

In an embodiment, the second active pattern may be disposed on a layer different from a layer of the first active pattern.

In an embodiment, the through hole may be adjacent to the driving transistor.

In an embodiment, the display device may further include a first conductive pattern disposed in the non-pixel area on the substrate, a second conductive pattern disposed on a same layer as the first conductive pattern, and a bridge pattern disposed on the organic layer and connecting the first conductive pattern and the second conductive pattern.

In an embodiment, the pixel area and the non-pixel area may constitute a display area, and the display area may include a foldable area having flexibility and a non-folding area adjacent to at least one side of the foldable area.

A method of manufacturing a display device according to embodiments of the present disclosure, the method may include steps of forming an inorganic insulating layer disposed on a substrate including a pixel area and a non-pixel area adjacent to the pixel area, forming a photoresist layer disposed on the inorganic insulating layer, simultaneously forming first and second grooves exposing an upper surface of the photoresist layer in the pixel area and an opening exposing an upper surface of the inorganic insulating layer in the non-pixel area by exposing the photoresist layer, forming a through hole overlapping the non-pixel area by etching the inorganic insulating layer corresponding to the opening, forming an organic film disposed on an entire surface of the photoresist layer to fill the first groove, the second groove, the opening, and the through hole, and forming a light emitting element in the pixel area disposed on the inorganic insulating layer.

In an embodiment, the simultaneously forming the first groove, the second groove, and the opening may be accomplished by placing a mask having a light transmission portion, a semi-transmission portion, and a light blocking portion on the photoresist layer, forming the opening by removing all of the photoresist layer corresponding to the light transmission portion, and forming the first groove and the second groove by removing a portion of the photoresist layer corresponding to the semi-transmission portion.

In an embodiment, the mask may include a halftone mask, a slit mask, or a phase shift mask.

In an embodiment, the light transmission portion may transmit all light, the semi-transmission portion may transmit some light, and the light blocking portion may block all light.

In an embodiment, the method may further include steps of forming a preliminary organic layer filling the through hole by etching an entire surface of the organic layer and exposing an upper surface of the inorganic insulating layer corresponding to the first groove and the second groove by etching an entire surface of the photoresist layer after the forming the organic film.

In an embodiment, the exposing the upper surface of the inorganic insulating layer corresponding to the first groove and the second groove may be accomplished by forming an organic layer filling the through hole and having an upper surface positioned at substantially a same level as an upper surface of the inorganic insulating layer based on a surface of the substrate by etching the preliminary organic layer.

In an embodiment, the method may further include steps of forming a first contact hole and a second contact hole by etching a portion of the inorganic insulating layer corresponding to the first groove and the second groove, respectively and removing the photoresist layer after the exposing the upper surface of the inorganic insulating layer corresponding to the first groove and the second groove.

In an embodiment, the method may further include a step of forming an active pattern including amorphous silicon or polycrystalline silicon in the pixel area on the substrate before the forming the inorganic insulating layer. Each of the first contact hole and the second contact hole may expose an upper surface of the active pattern.

In an embodiment, through hole may be formed through a process different from a process of the first contact hole and the second contact hole.

In an embodiment, the photoresist layer may be formed using a positive photoresist.

A display device according to an embodiment of the present disclosure may include an inorganic insulating layer having a through hole positioned in a non-pixel area adjacent to a pixel area and an organic layer filling the through hole. Accordingly, the organic layer may prevent stress or cracks caused by folding of the display device from propagating to other pixel areas.

In addition, in the method of manufacturing the display device according to an embodiment of the present disclosure, first and second grooves exposing the upper surface of a photoresist layer and an opening exposing the upper surface of an inorganic insulating layer by exposing the photoresist layer formed on the inorganic insulating layer may be formed at the same time, a through hole may formed by etching the inorganic insulating layer corresponding to the opening, an organic film may formed on an entire surface of the photoresist layer to fill the through hole, and an organic layer filling the through hole of the inorganic insulating layer may be formed by etching an entire organic film without a separate mask. Accordingly, a manufacturing process of the display device may be simplified and process costs may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
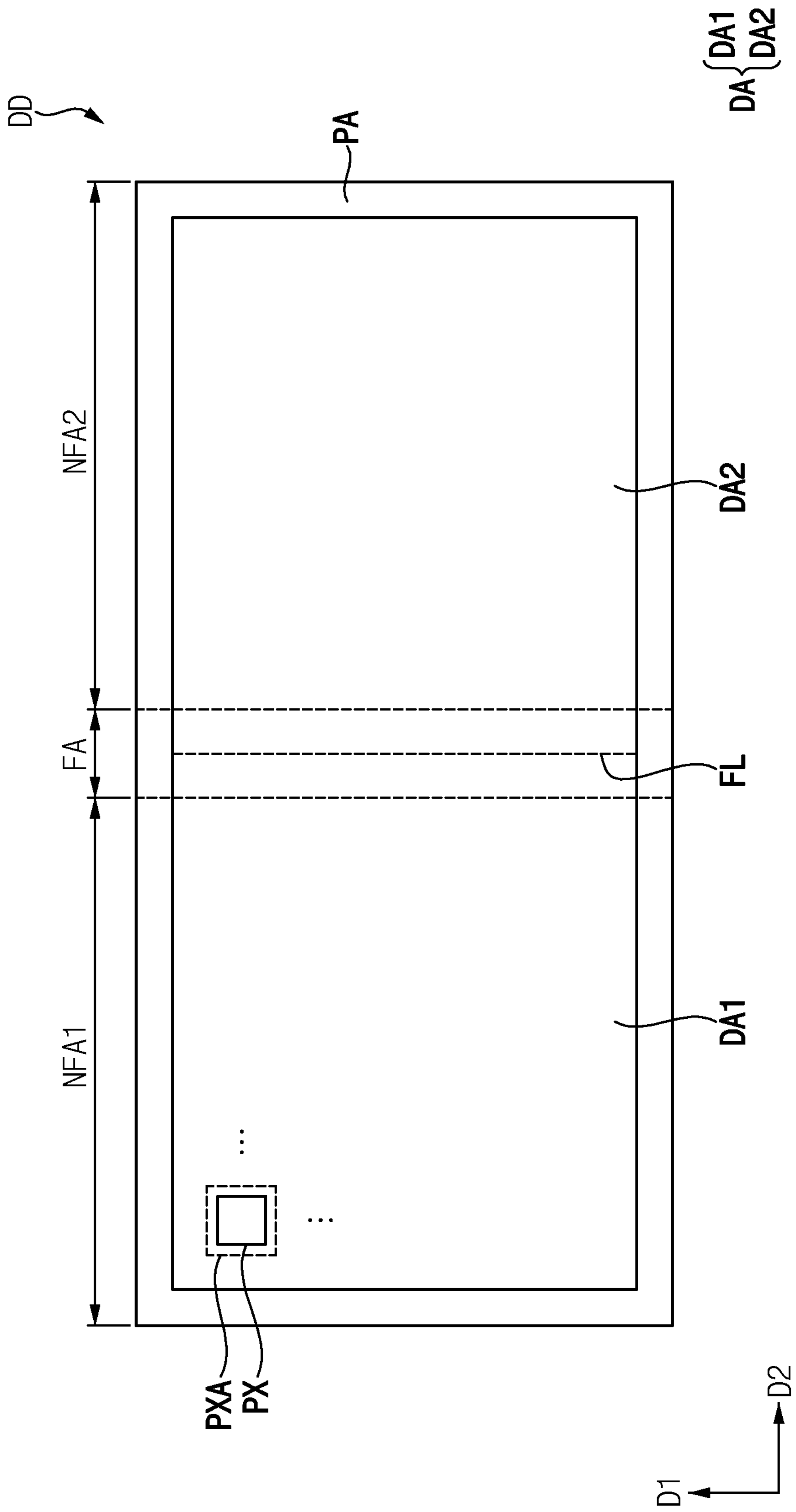
FIG. 1 is a plan view illustrating a display device according to an embodiment.

Hereinafter, a display device according to embodiments of the present disclosure will be explained in detail with reference to the accompanying drawings. The same reference numerals are used for the same components in the drawings, and redundant descriptions of the same components will be omitted.

Figure 2:
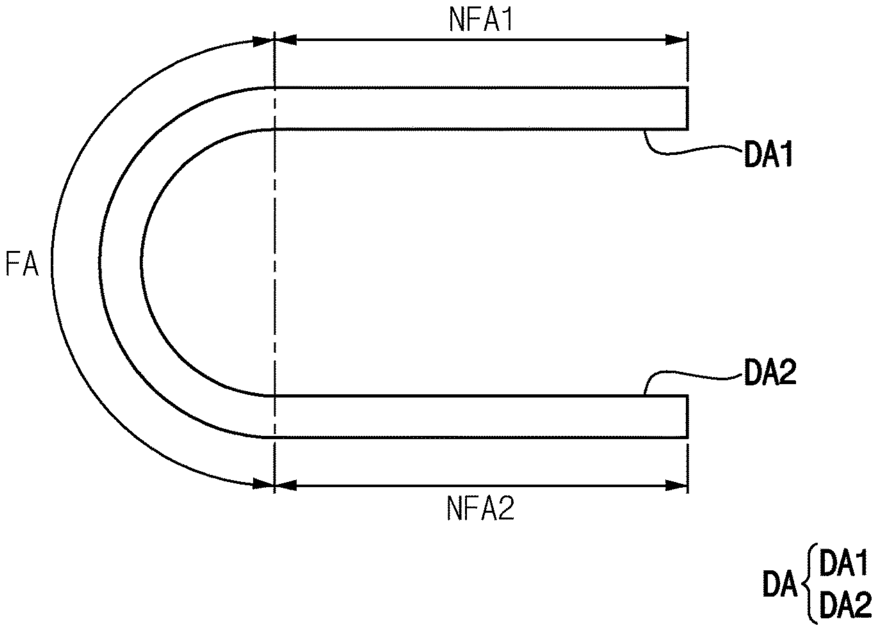
FIGS. 2 and 3 are cross-sectional views illustrating a folded state of the display device of FIG. 1.
Figure 3:
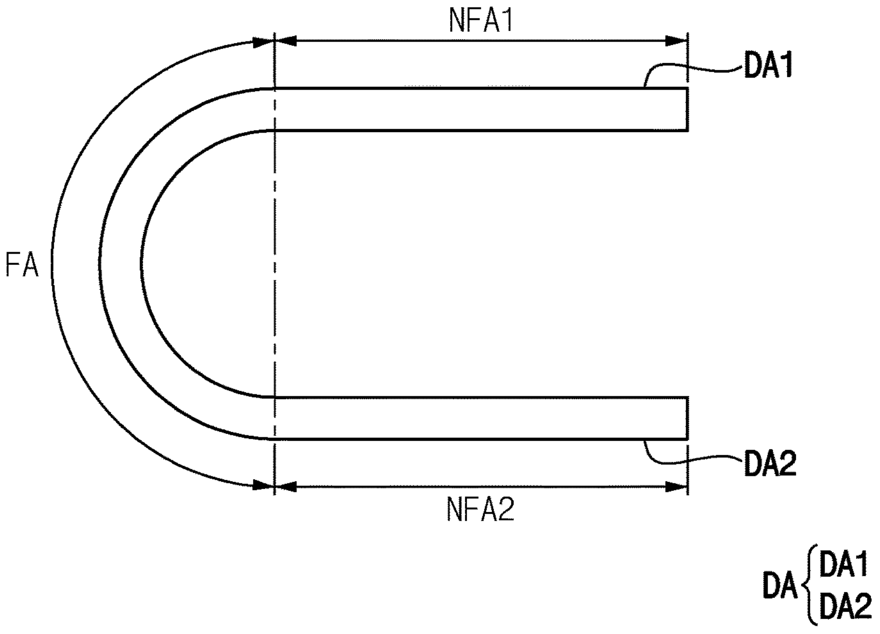

FIG. 1 is a plan view illustrating a display device according to an embodiment. FIGS. 2 and 3 are cross-sectional views illustrating a folded state of the display device of FIG. 1.

Referring to FIGS. 1, 2, and 3, a display device DD according to an embodiment of the present disclosure may include a display area DA and a peripheral area PA. The peripheral area PA may be positioned around the display area DA. For example, the peripheral area PA may surround at least a portion of the display area DA.

A plurality of pixels PX may be disposed in the display area DA. Specifically, each of the plurality of pixels PX may be disposed in a pixel area NPA positioned in the display area DA. Each of the plurality of pixels PX may emit light. As each of the plurality of pixels PX emits light, the display area DA may display an image. For example, each of the plurality of pixels PX may include a transistor and a light emitting element electrically connected to the transistor.

The plurality of pixels PX may be repeatedly arranged along a first direction D1 and a second direction D2 intersecting the first direction D1 in a plan view. For example, the first direction D1 may be perpendicular to the second direction D2.

A driver may be disposed in the peripheral area PA. The driver may provide signals and/or voltages to the plurality of pixels PX. For example, the driver may include a data driver and a gate driver. The peripheral area PA may not display an image.

At least a portion of the display device DD may be flexible, and the flexible portion (i.e., a foldable area FA) may be folded. That is, the display area DA may include the foldable area FA that may be bent by an external force to fold the display device DD and a non-folding area NFA1 and NFA2 adjacent to at least one side of the foldable area FA that is not folded. For example, the foldable area FA may have a folding line FL extending along the first direction D1. Here, the term "non-folding area" is for convenience of explanation, and the expression "non-folding" includes not only a hard case without flexibility but also a case that is flexible but not folded due to flexibility smaller than the foldable area FA.

The display area DA may be divided into a first display area DA1 and a second display area DA2 adjacent in the second direction D2 crossing the first direction D1. The first display area DA1 and the second display area DA2 may be continuously connected to substantially form one display area DA. For example, when the display area DA is folded along the folding line FL, as shown in FIG. 2, the display device DD may have an in-folding structure so that the first display area DA1 and the second display area DA2 face each other. Alternatively, when the display area DA is folded along the folding line FL, as shown in FIG. 3, the display device DD may have a folding structure so that the first display area DA1 and the second display area DA2 are disposed outside.

In addition, the display device DD according to an embodiment of the present disclosure is not limited to having one foldable area. For example, the display device DD may be folded multiple times or may have a plurality of foldable areas to implement a rollable display device.

Figure 4:
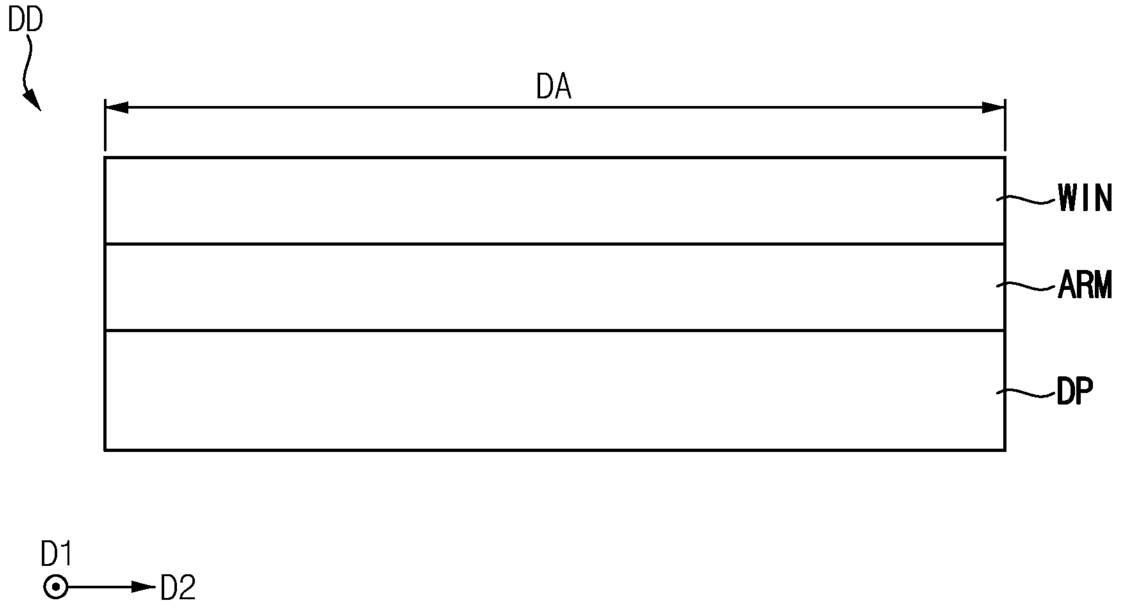
FIG. 4 is a cross-sectional view illustrating an example of the display device of FIG. 1.

FIG. 4 is a cross-sectional view illustrating an example of the display device of FIG. 1.

Referring to FIGS. 1 and 4, the display device DD according to an embodiment may include a display panel DP, an anti-reflection member ARM, and a window member WIN.

The display panel DP may include a substrate, a transistor, an insulating layer, and a light emitting element. The transistor and the light emitting element may constitute a pixel circuit. The pixel circuit may generate a driving current. A detailed description of components of the display panel DP will be described later.

The anti-reflection member ARM may be disposed on the display panel DP. The anti-reflection member ARM may reduce reflectance of light incident from the outside toward the display panel DP through the window member WIN. In an embodiment, the anti-reflection member ARM may include a thin polarizer. In another embodiment, the anti-reflection member ARM may include a black matrix and color filters.

The window member WIN may be disposed on the anti-reflection member ARM. The window member WIN may be attached to the anti-reflection member ARM through an adhesive layer. The window member WIN may have a transmission portion corresponding to the display area DA. For example, the window member WIN may include a polymer material or a glass thin film so as to be bendable. These may be used alone or in combination with each other.

Figure 5:
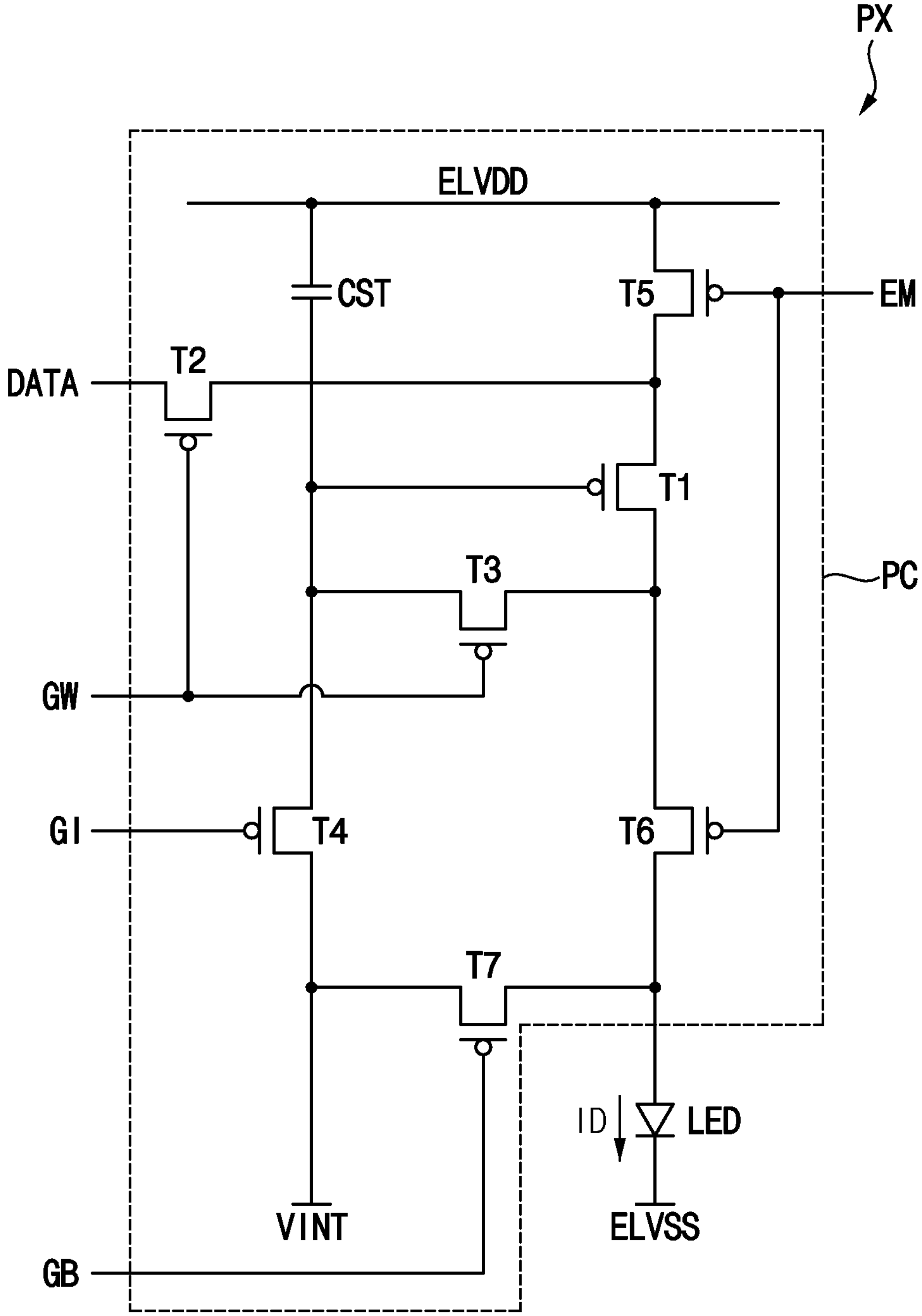
FIG. 5 is an equivalent circuit diagram illustrating each pixel disposed in a display area of FIG. 1.

FIG. 5 is an equivalent circuit diagram illustrating each pixel disposed in a display area of FIG. 1.

Referring to FIGS. 1 and 5, each pixel PX may include a pixel circuit PC and a light emitting diode LED. The pixel circuit PC may include first, second, third, fourth, fifth, sixth, and seventh transistors T1, T2, T3, T4, T5, T6, and T7 and a storage capacitor CST.

The light emitting diode LED may output light based on a driving current ID. The light emitting diode LED may include a first terminal and a second terminal. For example, the second terminal of the light emitting diode LED may receive a low power voltage ELVSS. For example, the first terminal of the light emitting diode LED may be an anode terminal, and the second terminal of the light emitting diode LED may be a cathode terminal. Alternatively, the first terminal of the light emitting diode LED may be a cathode terminal and the second terminal of the light emitting diode LED may be an anode terminal.

The first transistor T1 may include a gate terminal, a first terminal, and a second terminal. For example, the first terminal of the first transistor T1 may be a source terminal, and the second terminal of the first transistor T1 may be a drain terminal. Alternatively, the first terminal of the first transistor T1 may be a drain terminal, and the second terminal of the first transistor T1 may be a source terminal. This may be equally applied to the second, third, fourth, fifth, sixth, and seventh transistors T2, T3, T4, T5, T6, and T7 to be described below. Therefore, in the following, descriptions related to this will be omitted.

The first transistor T1 may generate the driving current ID. In an embodiment, the first transistor T1 may be defined as a driving transistor for driving the pixel PX. The first transistor T1 may generate the driving current ID based on a voltage difference between the gate terminal and the source terminal. In addition, a gray level may be expressed in the pixels PX based on the magnitude of the driving current ID supplied to the light emitting diode LED.

The second transistor T2 may include a gate terminal, a first terminal, and a second terminal. The gate terminal of the second transistor T2 may receive a first scan signal GW. The first terminal of the second transistor T2 may receive a data signal DATA. The second terminal of the second transistor T2 may be connected to the first terminal of the first transistor T1. The second transistor T2 may be defined as a switching transistor.

The second transistor T2 may supply the data signal DATA to the first terminal of the first transistor T1 during an activation period of the first scan signal GW. Conversely, the second transistor T2 may cut off the supply of the data signal DATA during an inactive period of the first scan signal GW.

The third transistor T3 may include a gate terminal, a first terminal, and a second terminal. The gate terminal of the third transistor T3 may receive the first scan signal GW. The first terminal of the third transistor T3 may be connected to a first terminal of the first transistor T1. The second terminal of the third transistor T3 may be connected to the gate terminal of the first transistor T1.

The fourth transistor T4 may include a gate terminal, a first terminal, and a second terminal. The gate terminal of the fourth transistor T4 may receive a data initialization signal GI. The first terminal of the fourth transistor T4 may receive an initialization voltage VINT. The second terminal of the fourth transistor may be connected to the second terminal of the third transistor T3.

The fourth transistor T4 may supply the initialization voltage VINT to the second terminal of the third transistor T3 during an activation period of the data initialization signal GI. That is, the fourth transistor T4 may initialize the second terminal of the third transistor T3 to the initialization voltage VINT during the activation period of the data initialization signal GI.

The fifth transistor T5 may include a gate terminal, a first terminal, and a second terminal. The gate terminal of the fifth transistor T5 may receive an emission control signal EM. The first terminal of the fifth transistor T5 may receive a high power supply voltage ELVDD. The second terminal of the fifth transistor T5 may be connected to the first terminal of the first transistor T1.

The fifth transistor T5 may supply the high power supply voltage ELVDD to the first terminal of the first transistor T1 during an activation period of the emission control signal EM. Conversely, the fifth transistor T5 may cut off the supply of the high power supply voltage ELVDD during an inactive period of the emission control signal EM.

The sixth transistor T6 may include a gate terminal, a first terminal, and a second terminal. The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the light emitting diode LED.

The sixth transistor T6 may supply the driving current ID generated by the first transistor T1 to the light emitting diode LED during the activation period of the light emission control signal EM. Conversely, the sixth transistor T6 may electrically separate the first transistor T1 and the light emitting diode LED from each other during the inactive period of the emission control signal EM.

The seventh transistor T7 may include a gate terminal, a first terminal, and a second terminal. The gate terminal of the seventh transistor T7 may receive a second scan signal GB. The first terminal of the seventh transistor T7 may receive the initialization voltage VINT. The second terminal of the seventh transistor T7 may be connected to the first terminal of the light emitting diode LED.

The storage capacitor CST may include a first terminal and a second terminal. The first terminal of the storage capacitor CST may be connected to the gate terminal of the first transistor T1. The second terminal of the storage capacitor CST may receive the high power supply voltage ELVDD.

However, although the pixel circuit PC has been described as including seventh transistors and one storage capacitor with reference to FIG. 5, the configuration of the present disclosure is not limited thereto. For example, the pixel circuit PC may have a configuration including at least one transistor and at least one storage capacitor.

Figure 6:
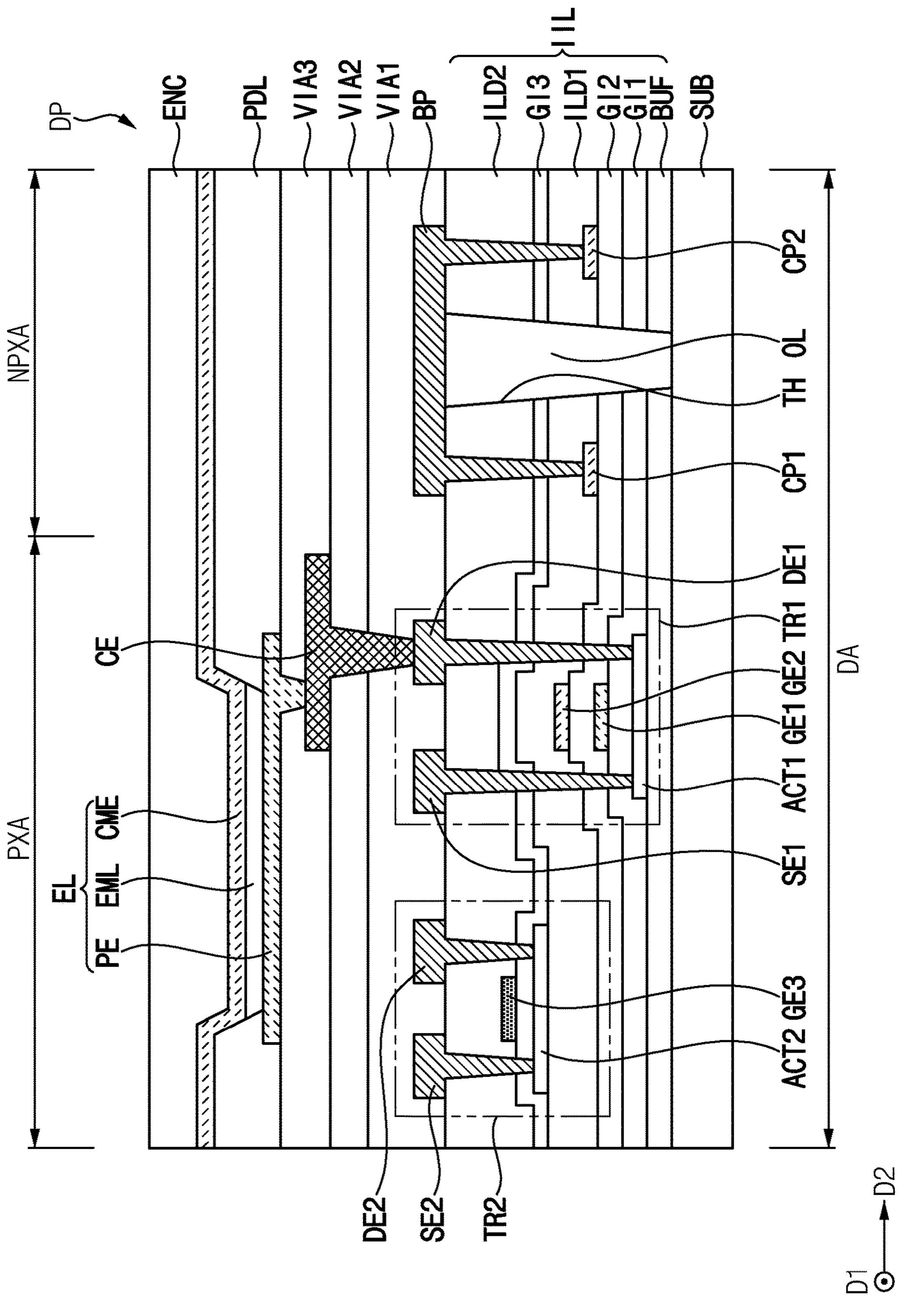
FIG. 6 is a cross-sectional view illustrating a portion of a display area of the display panel of FIG. 4.

FIG. 6 is a cross-sectional view illustrating a portion of a display area of the display panel of FIG. 4.

Referring to FIG. 6, the display panel DP of the display device DD according to an embodiment may include a substrate SUB, a buffer layer BUF, a first transistor TR1, a second transistor TR2, an inorganic insulating layer IIL, first and second conductive patterns CP1 and CP2, an organic layer OL, a bridge pattern BP, a first via insulating layer VIA1, a second via insulating layer VIA2, a third via insulating layer VIA3, a connection electrode CE, a pixel defining layer PDL, a light emitting element EL, and an encapsulation layer ENC.

Here, the inorganic insulating layer IIL may include a first gate insulating layer GI1, a second gate insulating layer GI2, a third gate insulating layer GI3, a first interlayer insulating layer ILD1, and a second interlayer insulating layer ILD2. The first transistor TR1 may include a first active pattern ACT1, a first gate electrode GE1, a second gate electrode GE2, a first source electrode SE1, and a first drain electrode DEL The second transistor TR2 may include a second active pattern ACT2, a third gate electrode GE3, a second source electrode SE2, and a second drain electrode DE2. The light emitting element EL may include a pixel electrode PE, a light emitting layer EML, and a common electrode CME.

As described with reference to FIG. 1, the display device DD may include the display area DA. As the display device DD includes the display area DA, the substrate SUB may also include the display area DA. At this time, the display area DA may include the pixel area PXA where pixels (e.g., pixels PX of FIG. 1) are disposed and a non-pixel area NPXA adjacent to the pixel area PA in which the pixels is not disposed.

The substrate SUB may include a transparent material or an opaque material. The substrate SUB may be made of a transparent resin substrate. Examples of the transparent resin substrate include polyimide substrates and the like. In this case, the polyimide substrate SUB may include a first organic layer, a first barrier layer, and a second organic layer. Alternatively, the substrate SUB may include a quartz substrate, a synthetic quartz substrate, a calcium fluoride substrate, an F-doped quartz substrate, a soda-lime glass substrate, a non-alkali glass substrate, and the like. These may be used alone or in combination with each other.

The buffer layer BUF may be disposed on the substrate SUB. The buffer layer BUF may prevent diffusion of metal atoms or impurities from the substrate SUB into the first and second transistors TR1 and TR2. In addition, the buffer layer BUF may improve flatness of the surface of the substrate SUB when the surface of the substrate SUB is not uniform. For example, the buffer layer BUF may include an inorganic material such as silicon oxide, silicon nitride, silicon oxynitride, and the like. These may be used alone or in combination with each other.

In an embodiment, an opening exposing an upper surface of the substrate SUB positioned in the non-pixel area NPXA may be defined in the buffer layer BUF.

The first active pattern ACT1 may be disposed in the pixel area PXA on the buffer layer BUF. In an embodiment, the first active pattern ACT1 may include an inorganic semiconductor such as amorphous silicon or polycrystalline silicon. For example, the first active pattern ACT1 may have a first source region, a first drain region, and a first channel region positioned between the first source region and the first drain region.

The first gate insulating layer GI1 may be disposed on the buffer layer BUF. The first gate insulating layer GI1 may continuously extend from the pixel area PXA to the non-pixel area NPXA. The first gate insulating layer GI1 may cover the first active pattern ACT1 and may be disposed along the profile of the first active pattern ACT1 to have a uniform thickness. Alternatively, the first gate insulating layer GI1 may sufficiently cover the first active pattern ACT1 and may have a substantially flat upper surface without creating a step around the first active pattern ACT1. For example, the first gate insulating layer GI1 may include an inorganic material such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and the like. These may be used alone or in combination with each other.

In an embodiment, an opening exposing an upper surface of the substrate SUB positioned in the non-pixel area NPXA may be defined in the buffer layer BUF, the first gate insulating layer GI1, the second gate insulating layer GI2, the first interlayer insulating layer ILD1, the third gate insulating layer GI3, and the second interlayer insulating layer ILD2.

The first gate electrode GE1 may be disposed in the pixel area PXA on the first gate insulating layer GIL The first gate electrode GE1 may overlap the first channel region of the first active pattern ACT1. The first gate electrode GE1 may include a metal, an alloy, a metal nitride, a conductive metal oxide, a transparent conductive material, and the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and the like. Examples of the conductive metal oxide may include indium tin oxide and indium zinc oxide. In addition, examples of the metal nitride may include aluminum nitride ("$AlN_x$"), tungsten nitride ("$WN_x$"), chromium nitride ($CrN_x$), and the like. These may be used alone or in combination with each other.

The second gate insulating layer GI2 may be disposed on the first gate insulating layer GI1. The second gate insulating layer GI2 may continuously extend from the pixel area PXA to the non-pixel area NPXA. The second gate insulating layer GI2 may cover the first gate electrode GE1 and may be disposed along the profile of the first gate electrode GE1 to have a uniform thickness. Alternatively, the first gate insulating layer GI1 may sufficiently cover the first gate electrode GE1 and may have a substantially flat upper surface without creating a step around the first gate electrode GE1. For example, the second gate insulating layer GI2 may include an inorganic material such as silicon oxide, silicon nitride, silicon oxynitride, and the like. These may be used alone or in combination with each other.

The second gate electrode GE2 may be disposed in the pixel area PXA on the second gate insulating layer GI2. The second gate electrode GE2 may overlap the first gate electrode GE1. For example, the second gate electrode GE2 may include a metal, an alloy, a metal nitride, a conductive metal oxide, a transparent conductive material, and the like. These may be used alone or in combination with each other.

First and second conductive patterns CP1 and CP2 may be disposed in the non-pixel area NPXA on the second gate insulating layer GI2. The first and second conductive patterns CP1 and CP2 may be disposed on the same layer as the second gate electrode GE2. That is, the first and second conductive patterns CP1 and CP2 may include the same material as the second gate electrode GE2 and may be formed through the same process.

The first interlayer insulating layer ILD1 may be disposed on the second gate insulating layer GI2. The first interlayer insulating layer ILD1 may continuously extend from the pixel area PXA to the non-pixel area NPXA. The first interlayer insulating layer ILD1 may cover the second gate electrode GE2 may be disposed along the profile of the second gate electrode GE2 to have a uniform thickness. Alternatively, the first interlayer insulating layer ILD1 may sufficiently cover the second gate electrode GE2 and may have a substantially flat upper surface without creating a step around the second gate electrode GE2. For example, the first interlayer insulating layer ILD1 may include an inorganic material such as silicon oxide, silicon nitride, silicon oxynitride, and the like. These may be used alone or in combination with each other.

The second active pattern ACT2 may be disposed in the pixel area PXA on the first interlayer insulating layer ILD1. In an embodiment, the second active pattern ACT2 may include a metal oxide semiconductor. For example, the second active pattern ACT2 may have a second source region, a second drain region, and a second channel region positioned between the second source region and the second drain region.

The metal oxide semiconductor may include two-component compound ("$AB_x$"), a ternary compound ("$ABxC_y$), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may include zinc oxide ("$ZnO_x$"), gallium oxide ("$GaO_x$"), tin oxide ("SnOx), indium oxide ("InOx), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

The third gate insulating layer GI3 may be disposed on the first interlayer insulating layer ILD1. The third gate insulating layer GI3 may continuously extend from the pixel area PXA to the non-pixel area NPXA. The third gate insulating layer GI3 may cover the second active pattern ACT2 and may be disposed along the profile of the second active pattern ACT2 to have a uniform thickness. Alternatively, the third gate insulating layer GI3 may sufficiently cover the second active pattern ACT2 and may have a substantially flat upper surface without creating a step around the second active pattern ACT2. For example, the third gate insulating layer GI3 may include an inorganic material such as silicon oxide, silicon nitride, silicon oxynitride, and the like. These may be used alone or in combination with each other.

The third gate electrode GE3 may be disposed in the pixel area PXA on the third gate insulating layer GI3. The third gate electrode GE3 may overlap the second channel region of the second active pattern. For example, the third gate electrode GE3 may include a metal, an alloy, a metal nitride, a conductive metal oxide, a transparent conductive material, and the like. These may be used alone or in combination with each other.

The second interlayer insulating layer ILD2 may be disposed on the third gate insulating layer GI3. The second interlayer insulating layer ILD2 may continuously extend from the pixel area PXA to the non-pixel area NPXA. The second interlayer insulating layer ILD2 may sufficiently cover the third gate electrode GE3 and may have a substantially flat upper surface without creating a step around the third gate electrode GE3. Alternatively, the second interlayer insulating layer ILD2 may cover the third gate electrode GE3 and may be disposed along the profile of the third gate electrode GE3 to have a uniform thickness. For example, the second interlayer insulating layer ILD2 may include an inorganic material such as silicon oxide, silicon nitride, silicon oxynitride, and the like. These may be used alone or in combination with each other.

In an embodiment, a through hole TH may be formed in the inorganic insulating layer IIL positioned in the non-pixel area NPXA. That is, the through hole TH may be adjacent to the pixel area PXA. The through hole TH may include the opening of the buffer layer BUF, the first gate insulating layer GI1, the second gate insulating layer GI2, the first interlayer insulating layer ILD1, the third gate insulating layer GI3, and the second interlayer insulating layer ILD2. However, the present disclosure is not limited thereto, and the opening may not be formed in the buffer layer BUF.

The opening of the buffer layer BUF, the first gate insulating layer GI1, the second gate insulating layer GI2, the first interlayer insulating layer ILD1, the third gate insulating layer GI3, and the second interlayer insulating layer ILD2 may overlap each other and may have a tapered shape in a thickness direction so that the opening of the buffer layer BUF is smaller than the opening of the second interlayer insulating layer ILD2. For example, inner surfaces of the opening of the buffer layer BUF, the first gate insulating layer GI1, the second gate insulating layer GI2, the first interlayer insulating layer ILD1, the third gate insulating layer GI3, the second interlayer insulating layer ILD2 may coincide with a straight line on a cross section. Alternatively, the opening of the buffer layer BUF, the first gate insulating layer GI1, the second gate insulating layer GI2, the first interlayer insulating layer ILD1, the third gate insulating layer GI3, and the second interlayer insulating layer ILD2 may not overlap each other so that inner surfaces the opening of the buffer layer BUF, the first gate insulating layer GI1, the second gate insulating layer GI2, the first interlayer insulating layer ILD1, and the third gate insulating layer GI3 and the second interlayer insulating layer ILD2 may not coincide with a straight line in cross section.

The organic layer OL may be filled in the through hole TH of the inorganic insulating layer IIL. For example, the organic layer OL may fill at least a portion of the through hole TH of the inorganic insulating layer IIL. That is, the organic layer OL may not completely fill the through hole TH of the inorganic insulating layer IIL. However, in order for the organic layer OL to absorb external impact, to completely fill the through hole TH is preferable. The organic layer OL may prevent stress or cracks caused by folding of the display panel DP from propagating to other pixel areas. For example, the organic layer OL may include phenolic resin, polyacrylates resin, polyimide resin, polyamides resin, siloxane resin, epoxy resin, and the like. These may be used alone or in combination with each other.

In an embodiment, the upper surface of the organic layer OL may be positioned at substantially the same level as the upper surface of the inorganic insulating layer IIL based on the surface of the substrate SUB. That is, the organic layer OL may not extend to the upper surface of the inorganic insulating layer IIL.

The first source electrode SE1 and the first drain electrode DE1 may be disposed in the pixel area PXA on the second interlayer insulating layer ILD2. The first source electrode SE1 may be connected to the first source region of the first active pattern ACT1 through a contact hole passing through the inorganic insulating layer IIL excluding the buffer layer BUF. The first drain electrode DE1 may be connected to the first drain region of the first active pattern ACT1 through a contact hole passing through the inorganic insulating layer IIL except for the buffer layer BUF. For example, the first source electrode SE1 and the first drain electrode DE1 may include a metal, an alloy, a metal nitride, a conductive metal oxide, a transparent conductive material, and the like. These may be used alone or in combination with each other.

The second source electrode SE2 and the second drain electrode DE2 may be disposed in the pixel area PXA on the second interlayer insulating layer ILD2. The second source electrode SE2 may be connected to the second source region of the second active pattern ACT2 through a contact hole passing through the third gate insulating layer GI3 and the second interlayer insulating layer ILD2. The second drain electrode DE2 may be connected to the second drain region of the second active pattern ACT2 through a contact hole passing through the third gate insulating layer GI3 and the second interlayer insulating layer ILD2. The second source electrode SE2 and the second drain electrode DE2 may include the same material as the first source electrode SE1 and the first drain electrode DE2 and may be disposed on the same layer.

The bridge pattern BP may be disposed in the non-pixel area NPXA on the second interlayer insulating layer ILD2. The bridge pattern BP may be connected to the first and second conductive patterns CP1 and CP2 through contact holes passing through the first interlayer insulating layer ILD1, the third gate insulating layer GI3, and the second interlayer insulating layer ILD2. Through this, the bridge pattern BP may connect the first conductive pattern CP1 and the second conductive pattern CP2. The bridge pattern BP may include the same material as the first source electrode SE1, the first drain electrode DE1, the second source electrode SE2, and the second drain electrode DE2 and may be disposed on the same layer as the first source electrode SE1, the first drain electrode DE1, the second source electrode SE2, and the second drain electrode DE2.

Accordingly, the first transistor TR1 including the first active pattern ACT1, the first gate electrode GE1, the second gate electrode GE2, the first source electrode SE1, and the first drain electrode DE1 may be disposed in the pixel area PXA, and the second transistor TR1 including the second active pattern ACT2, the third gate electrode GE3, the second source electrode SE2, and the second drain electrode DE2 may be disposed in the pixel area PXA. Here, the first transistor TR1 may be defined as a driving transistor, and the second transistor TR2 may be defined as a switching transistor.

The first via insulating layer VIA1 may be disposed on the second interlayer insulating layer ILD2. The first via insulating layer VIA1 may sufficiently cover the first source electrode SE1, the first drain electrode DE1, the second source electrode SE2, the second drain electrode DE2, and the bridge pattern BP. The first via insulating layer VIA1 may include an organic material. For example, the first via insulating layer VIA1 may include an organic material such as polyimide resin, polyamide resin, siloxane resin, epoxy resin, and the like. These may be used alone or in combination with each other.

The second via insulating layer VIA2 may be disposed on the first via insulating layer VIAL The second via insulating layer VIA2 may have a substantially flat upper surface. The second via insulating layer VIA2 may include an organic material. For example, the second via insulating layer VIA2 may include an organic material such as polyimide resin, polyamide resin, siloxane resin, epoxy resin, and the like. These may be used alone or in combination with each other.

The connection electrode CE may be disposed on the second via insulating layer VIA2. The connection electrode CE may be connected to the first drain electrode DE1 through a contact hole passing through the first via insulating layer VIA1 and the second via insulating layer VIA2. Accordingly, the connection electrode CE may electrically connect the first transistor TR1 and the light emitting element EL. For example, the connection electrode CE may include a metal, an alloy, a metal nitride, a conductive metal oxide, a transparent conductive material, and the like. These may be used alone or in combination with each other.

The third via insulating layer VIA3 may be disposed on the second via insulating layer VIA2. The third via insulating layer VIA3 may have a substantially flat upper surface. The third via insulating layer VIA3 may include an organic material. For example, the third via insulating layer VIA3 may include an organic material such as polyimide resin, polyamide resin, siloxane resin, epoxy resin, and the like. These may be used alone or in combination with each other.

The pixel electrode PE may be disposed in the pixel area PXA on the third via insulating layer VIA3. The pixel electrode PE may be connected to the connection electrode CE through a contact hole passing through the third via insulating layer VIA3. For example, the pixel electrode PE may include a metal, an alloy, a metal nitride, a conductive metal oxide, a transparent conductive material, and the like. These may be used alone or in combination with each other. For example, the pixel electrode PE may act as an anode.

The pixel defining layer PDL may be disposed on the third via insulating layer VIA3. The pixel defining layer PDL may cover both sides of the pixel electrode PE. For example, the pixel defining layer PDL may include an inorganic material or an organic material. In an embodiment, the pixel defining layer PDL may include an organic material such as an epoxy resin, a siloxane resin, and the like. These may be used alone or in combination with each other. In another embodiment, the pixel defining layer PDL may further include a light blocking material containing a black pigment or black dye.

The light emitting layer EML may be disposed on the pixel electrode PE. The light emitting layer EML may include an organic material that emits light of a predetermined color. For example, the light emitting layer EML may include an organic material that emits at least one of red light, green light, and blue light.

The common electrode CME may be disposed on the pixel defining layer PDL and the light emitting layer EML. For example, the common electrode CME may include a metal, an alloy, a metal nitride, a conductive metal oxide, a transparent conductive material, and the like. These may be used alone or in combination with each other. For example, the common electrode CME may operate as a cathode.

Accordingly, the light emitting element EL including the pixel electrode PE, the light emitting layer EML, and the common electrode CME may be disposed in the pixel area PXA.

The encapsulation layer ENC may be disposed on the common electrode CME. The encapsulation layer ENC may prevent impurities, moisture, air, and the like from permeating the light emitting element EL from the outside. The encapsulation layer ENC may include at least one inorganic layer and at least one organic layer. For example, the inorganic layer may include silicon oxide, silicon nitride, silicon oxynitride, and the like. These may be used alone or in combination with each other. The organic layer may include a polymer cured material such as polyacrylate.

FIGS. 7, 8, 9, 10, 11, 12, 13, 14, 15, 16, 17, 18, 19, and 20 are cross-sectional views illustrating a manufacturing method of the display panel of FIG. 6.

Figure 7:
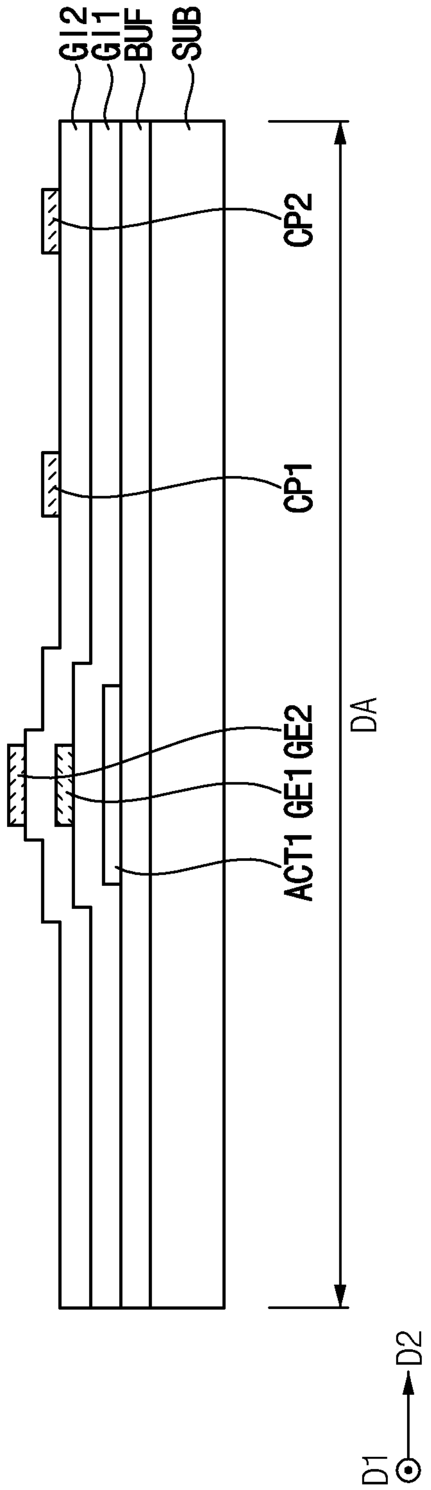
FIGS. 7, 8, 9, 10, 11, 12, 13, 14, 15, 16, 17, 18, 19, and 20 are cross-sectional views illustrating a manufacturing method of the display panel of FIG. 6.
Figure 8:
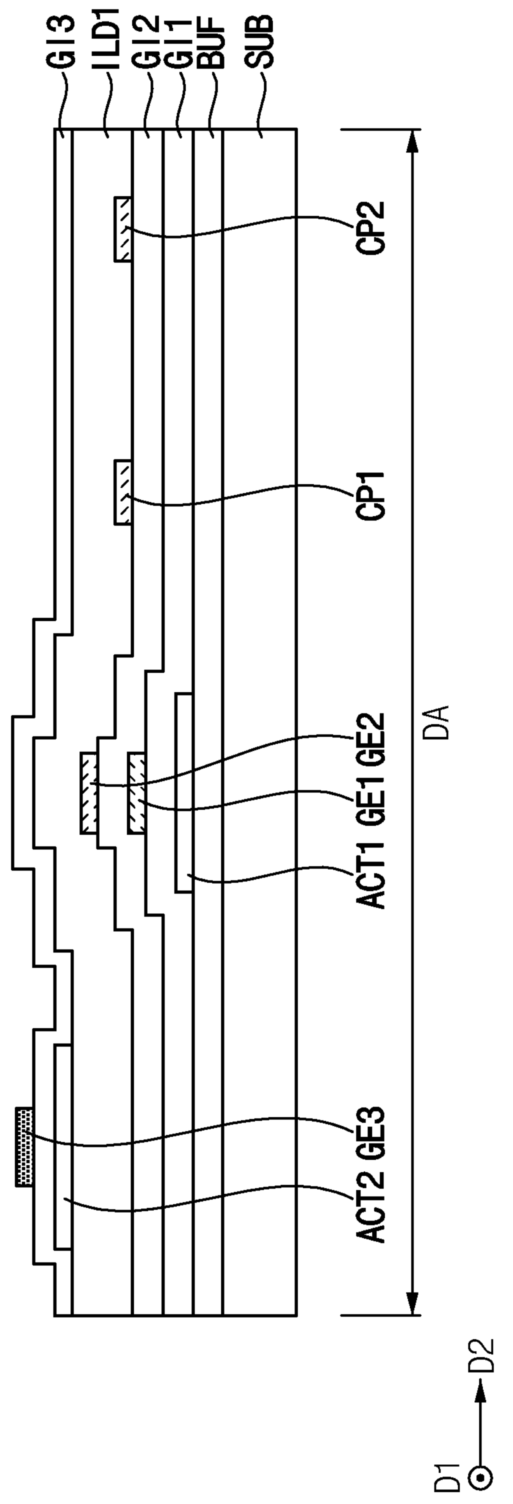

Referring to FIG. 7, the buffer layer BUF may be formed on the substrate SUB. For example, the buffer layer BUF may be formed using an inorganic material. The first active pattern ACT1 may be formed on the buffer layer BUF. The first active pattern ACT1 may be formed using amorphous silicon or polycrystalline silicon formed by crystallizing the amorphous silicon.

The first gate insulating layer GI1 may be formed on the buffer layer BUF. A first gate electrode GE1 may be formed on the first gate insulating layer GI1. The first gate electrode GE1 may overlap the first active pattern ACT1. The second gate insulating layer GI2 may be formed on the first gate insulating layer GI1. The second gate electrode GE2, the first conductive pattern CP1, and the second conductive pattern CP2 may be formed on the second gate insulating layer GI2. The second gate electrode GE2, the first conductive pattern CP1, and the second conductive pattern CP2 may be simultaneously formed using the same material.

For example, each of the first gate insulating layer GI1 and the second gate insulating layer GI2 may be formed using an inorganic material such as silicon oxide, silicon nitride, and the like. For example, the second gate electrode GE2 and each of the first and second conductive patterns CP1 and CP2 may be formed of a metal, a conductive metal oxide, and the like.

For example, each of the first gate insulating layer GI1 and the second gate insulating layer GI2 may be formed using an inorganic material such as silicon oxide, silicon nitride, and the like. For example, the second gate electrode GE2 and each of the first and second conductive patterns CP1 and CP2 may be formed of a metal, a conductive metal oxide, and the like.

The third gate insulating layer GI3 may be formed on the first interlayer insulating layer ILD1 to cover the second active pattern ACT2. The third gate electrode GE3 may be formed on the third gate insulating layer GI3. The third gate electrode GE3 may overlap the second active pattern ACT2.

For example, each of the first interlayer insulating layer ILD2 and the third gate insulating layer GI3 may be formed using an inorganic material such as silicon oxide, silicon nitride, and the like. The third gate electrode GE3 may be formed using metal, conductive metal oxide, and the like.

Figure 9:
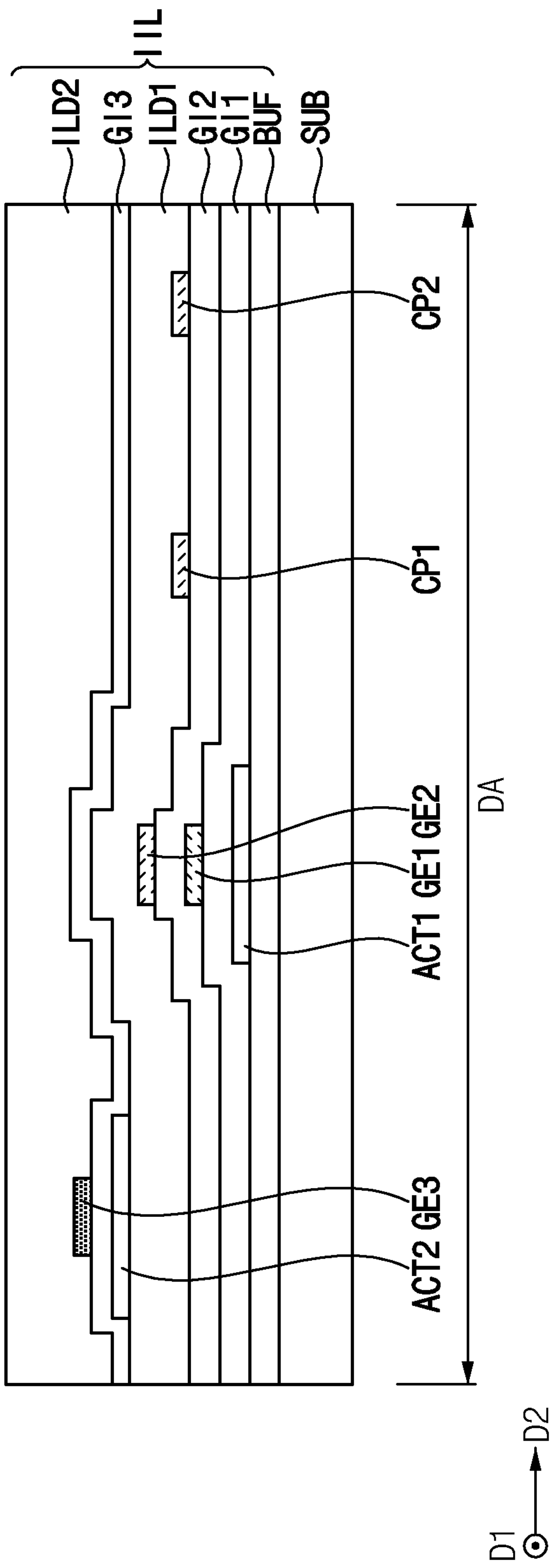

Referring to FIG. 9, the second interlayer insulating layer ILD2 may be formed on the third gate insulating layer GI3 to cover the third gate electrode GE3. For example, the second interlayer insulating layer ILD2 may be formed using an inorganic material such as silicon oxide, silicon nitride, and the like.

Accordingly, the inorganic insulating layer IIL including the buffer layer BUF, the first gate insulating layer GI1, the second gate insulating layer GI2, the first interlayer insulating layer ILD1, the third gate insulating layer GI3, and the second interlayer insulating layer ILD2 may be formed on the substrate SUB.

Figure 10:
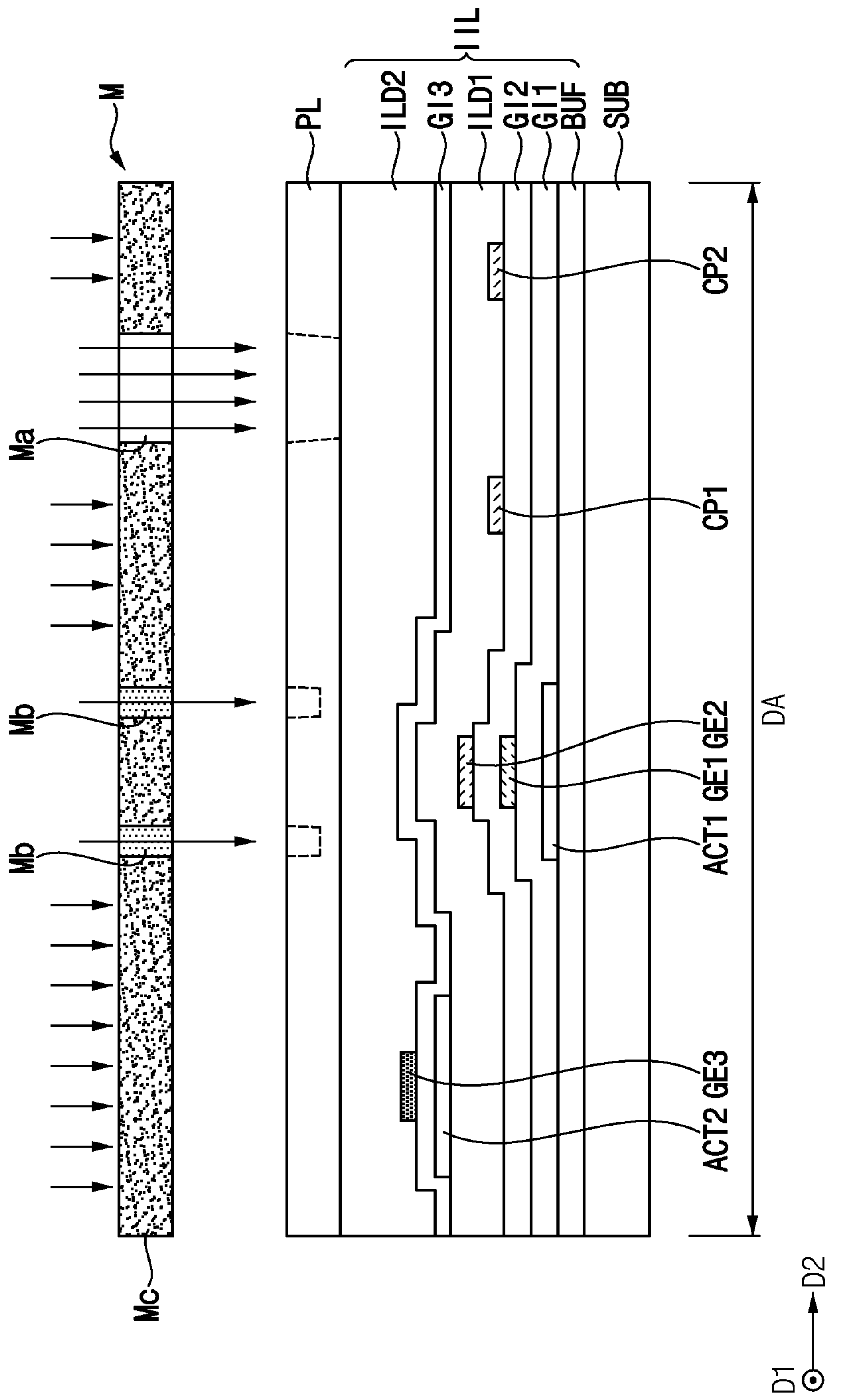
Figure 11:
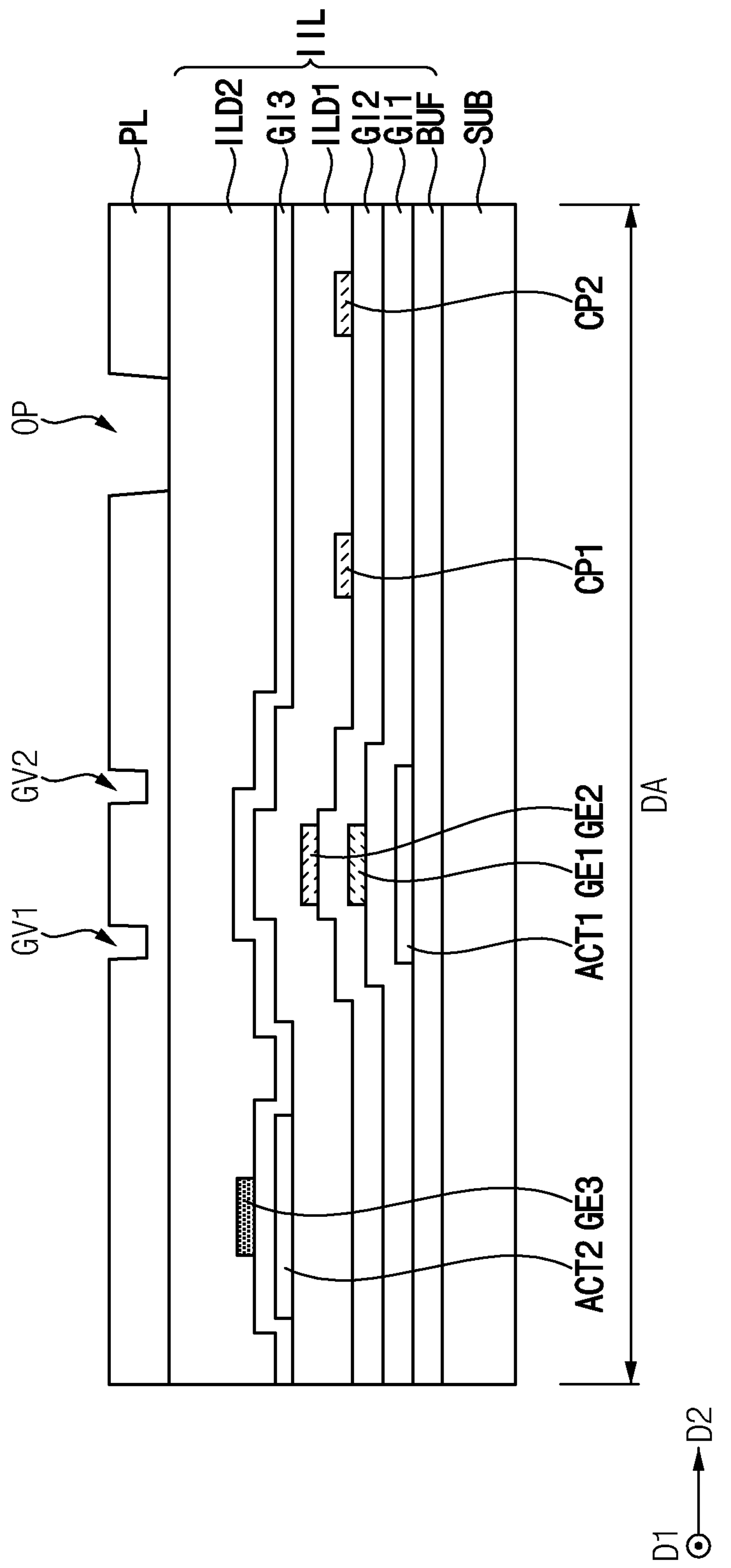

Referring to FIGS. 6, 10 and 11, a photoresist layer PL may be formed on the second interlayer insulating layer ILD2. In an embodiment, the photoresist layer PL may be formed using a positive photoresist. In another embodiment, the photoresist layer PL may be formed using negative photoresist. However, hereinafter, an example in which the photoresist layer PL is formed using a positive photoresist will be described.

A mask M may be positioned on the photoresist layer PL. In an embodiment, the mask M may include any one of a halftone mask, a slit mask, and a phase shift mask.

In an embodiment, the mask M may have a light transmission portion Ma, a semi-transmission portion Mb, and a light blocking portion Mc. The light transmission portion Ma may transmit all light, the semi-transmitting portion Mb may transmit some of the light, and the light blocking portion Mc may block all light.

Through the mask M, an area in which all of photoresist layer PL is removed, an area in which all of the photoresist layer PL remains, and an area in which only a portion of the photoresist layer PL is removed may be exposed to different degrees.

By exposing the photoresist layer PL through the mask M, a first groove GV1, a second groove GV2, and an opening OP may be simultaneously formed.

The first groove GV1 and the second groove GV2 may be positioned in the pixel area PXA and may expose an upper surface of the photoresist layer PL. The opening OP may be positioned in the non-pixel area NPXA and may expose an upper surface of the inorganic insulating layer IIL (specifically, an upper surface of the second interlayer insulating layer ILD2).

Specifically, the first groove GV1 and the second groove GV2 may be formed by removing a portion of the photoresist layer PL corresponding to the semi-transmission portion Mb of the mask M. The opening OP may be formed by removing all of the photoresist layer PL corresponding to the light transmission portion Ma of the mask M.

Figure 12:
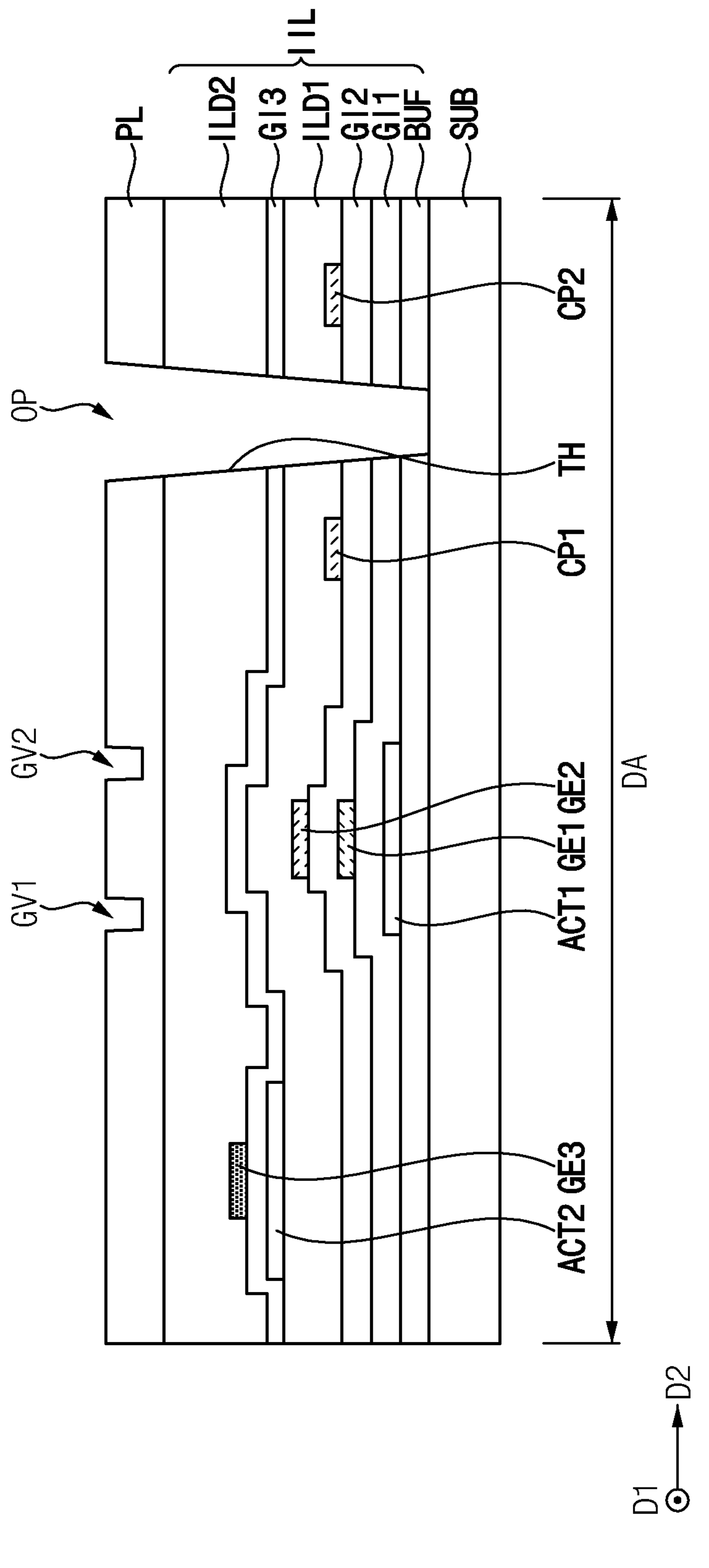

Referring to FIG. 12, a portion of the inorganic insulating layer IIL corresponding to the opening OP of the photoresist layer PL may be etched using the photoresist layer PL as a mask. Accordingly, the through hole TH passing through the inorganic insulating layer IIL corresponding to the opening OP of the photoresist layer PL may be formed. That is, the through hole TH may be formed in the inorganic insulating layer IIL positioned in the non-pixel area NPXA.

Figure 13:
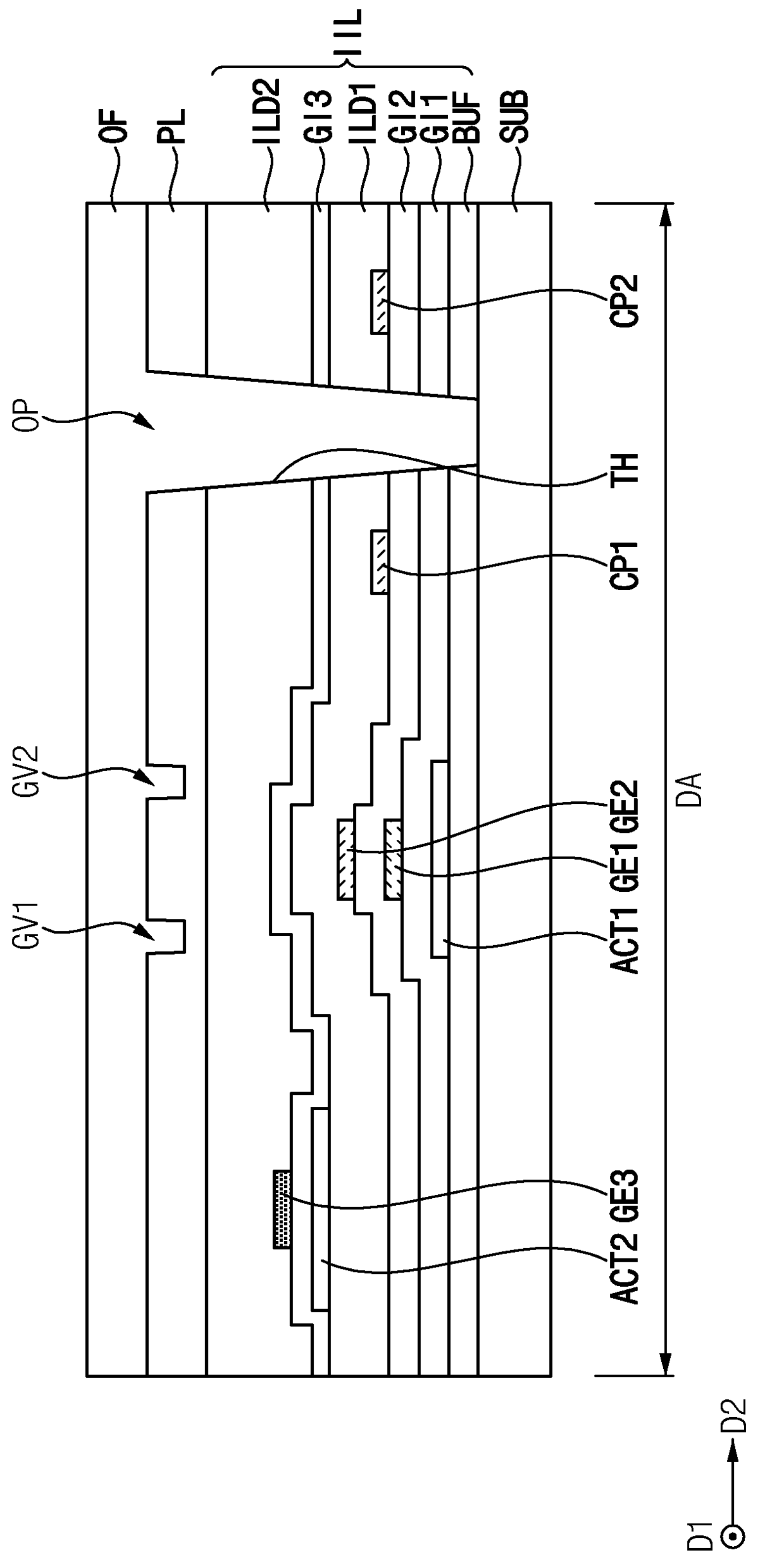

Referring to FIG. 13, the organic film OF may be formed on the entire surface of the photoresist layer PL. That is, the organic film OF may be formed on the entire surface of the photoresist layer PL to fill the first groove GV1, the second groove GV2, and the opening OP of the photoresist layer PL and the through hole TH of the inorganic insulating layer IIL. For example, the organic film OF may be formed using an organic material such as a polyimide resin, a polyamide resin, a siloxane resin, an epoxy resin, and the like.

Figure 14:
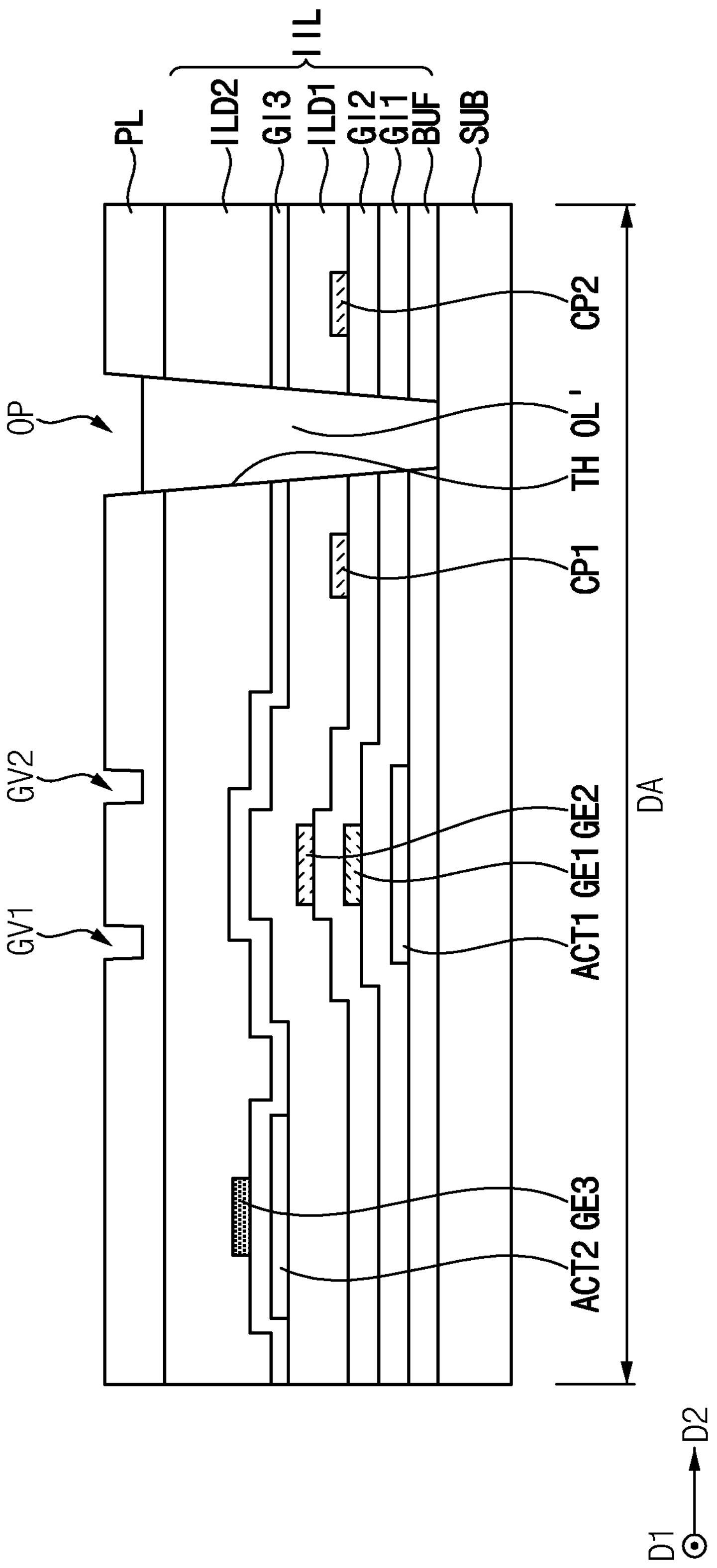

Referring to FIG. 14, an entire surface of the organic film OF may be etched. As the entire surface of the organic film OF is etched, a preliminary organic layer OL' filling the through hole TH of the inorganic insulating layer IIL may be formed. That is, as the entire surface of the organic film OF is etched, the organic film OF may remain only in the through hole TH of the inorganic insulating layer IIL. In this case, the upper surface of the preliminary organic layer OL' may be positioned at a level higher than the upper surface of the inorganic insulating layer IIL based on the surface of the substrate SUB.

Figure 15:
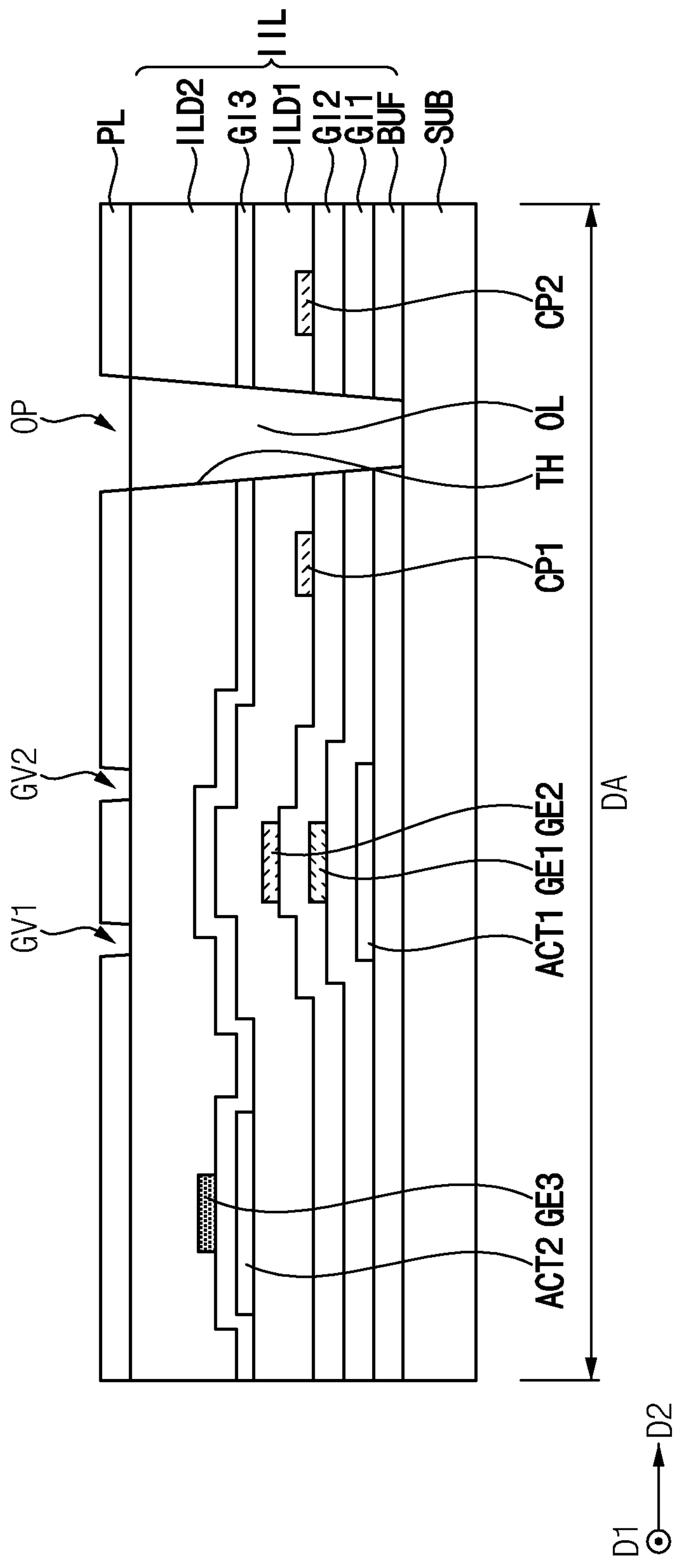

Referring to FIG. 15, the preliminary organic layer OL' and the photoresist layer PL may be entirely etched. As the photoresist layer PL is entirely etched, the upper surface of the inorganic insulating layer IIL (specifically, the upper surface of the second interlayer insulating layer ILD2)

corresponding to each of the first and second grooves GV1 and GV2 of the photoresist layer PL may be exposed. In addition, as the preliminary organic layer OL' is entirely etched, the organic layer OL may be formed to fill the through hole TH of the inorganic insulating layer IIL and have an upper surface positioned at substantially the same level as the upper surface of the inorganic insulating layer IIL with respect to the surface of the substrate SUB. That is, the thickness of the organic layer OL may be smaller than the thickness of the preliminary organic layer OL'.

When forming the organic layer OL filling the through hole TH of the inorganic insulating layer IIL by removing a portion of the organic film OF by the above-described method, a separate mask may not be required. Accordingly, process costs may be reduced.

Figure 16:
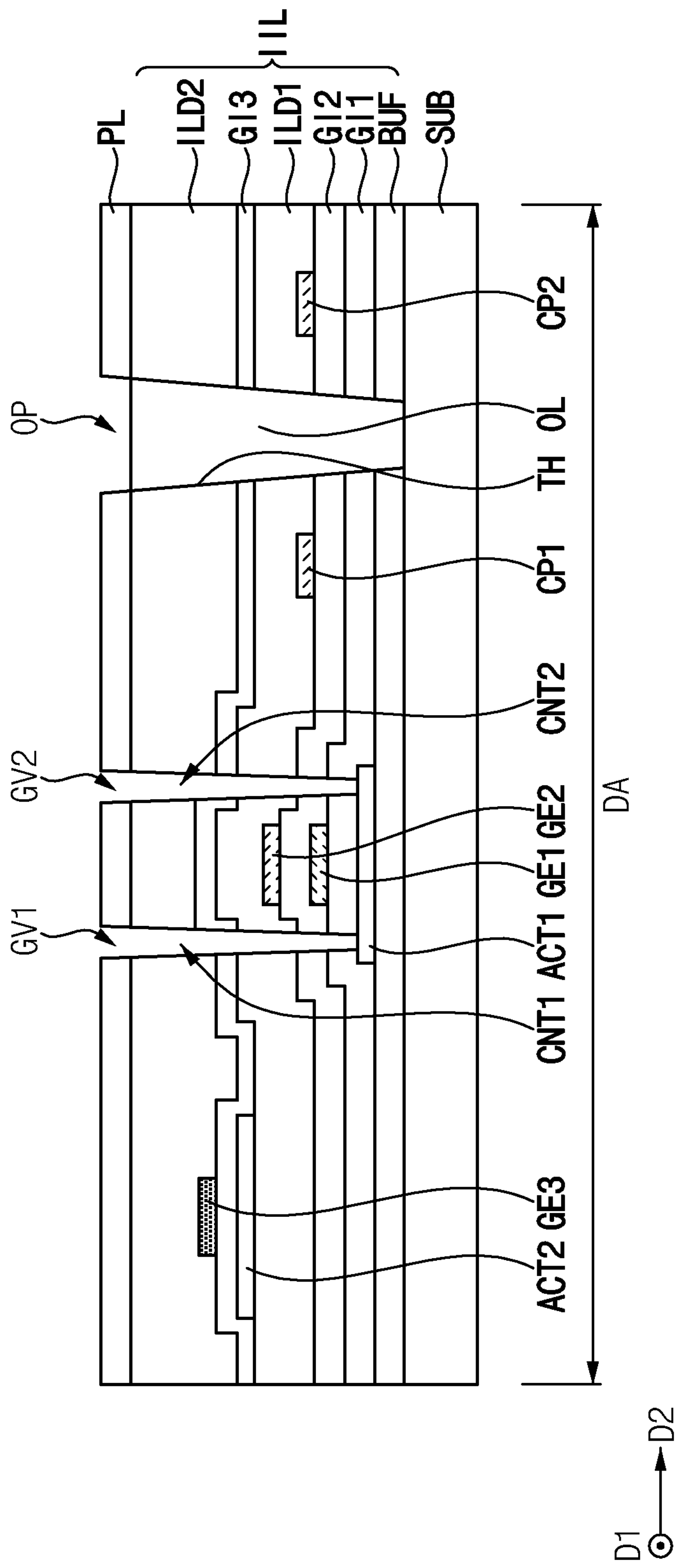
Figure 17:
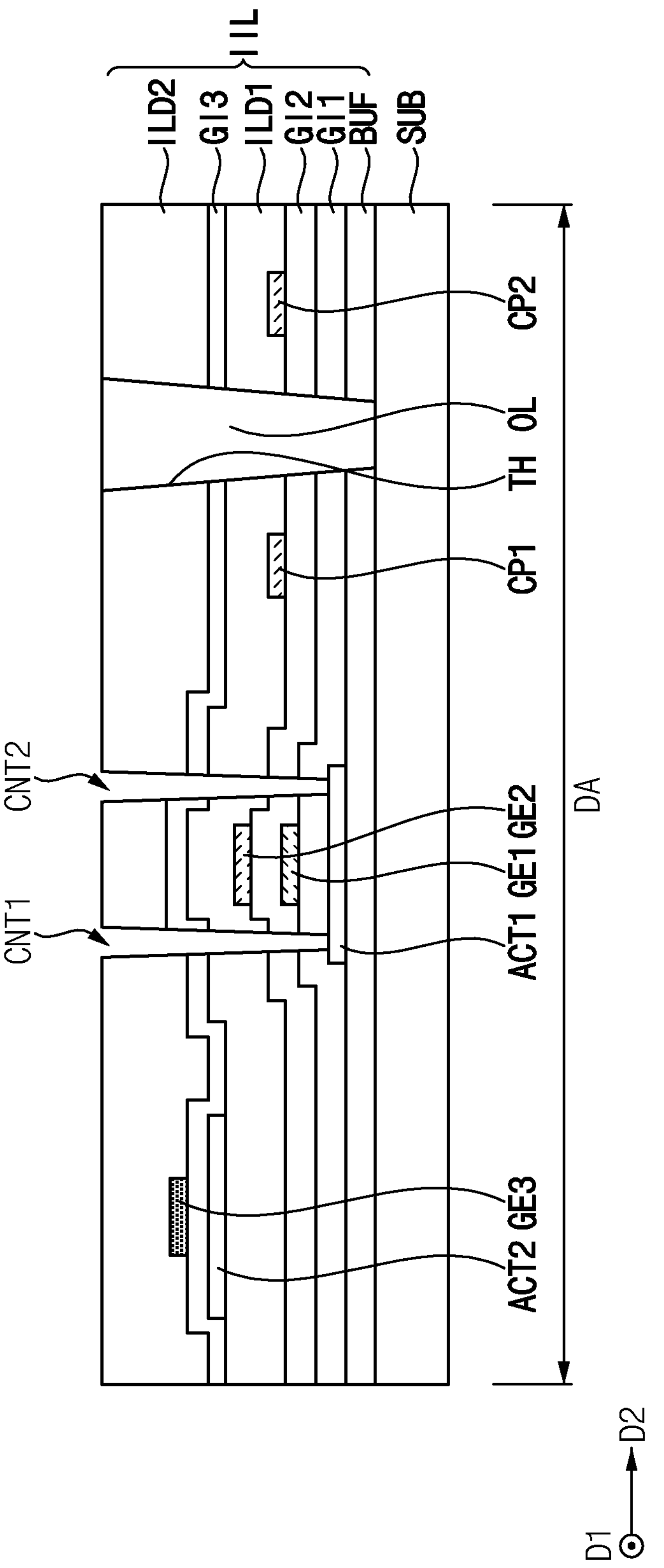

Referring to FIGS. 16 and 17, a first contact hole CNT1 may be formed by etching a portion of the inorganic insulating layer IIL corresponding to the first groove GV1, and a second contact hole CNT2 may be formed by etching a portion of the inorganic insulating layer IIL corresponding to the second groove GV2. That is, the first and second contact holes CNT1 and CNT2 may be formed simultaneously. The first contact hole CNT1 may expose a portion (i.e., the source region) of an upper surface of the first active pattern ACT1, and the second contact hole CNT2 may expose a portion (i.e., the drain region) of an upper surface of the first active pattern ACT1.

In an embodiment, the first and second contact holes CNT1 and CNT2 may be formed through a process different from a process of the through hole TH of the inorganic insulating layer IIL. That is, after the through hole TH is formed in the inorganic insulating layer IIL positioned in the non-pixel area NPXA, the first and second contact holes CNT1 and CNT2 may be formed in the inorganic insulating layer IIL positioned in the pixel area PXA.

After the first and second contact holes CNT1 and CNT2 are formed, the photoresist layer PL may be removed.

Figure 18:
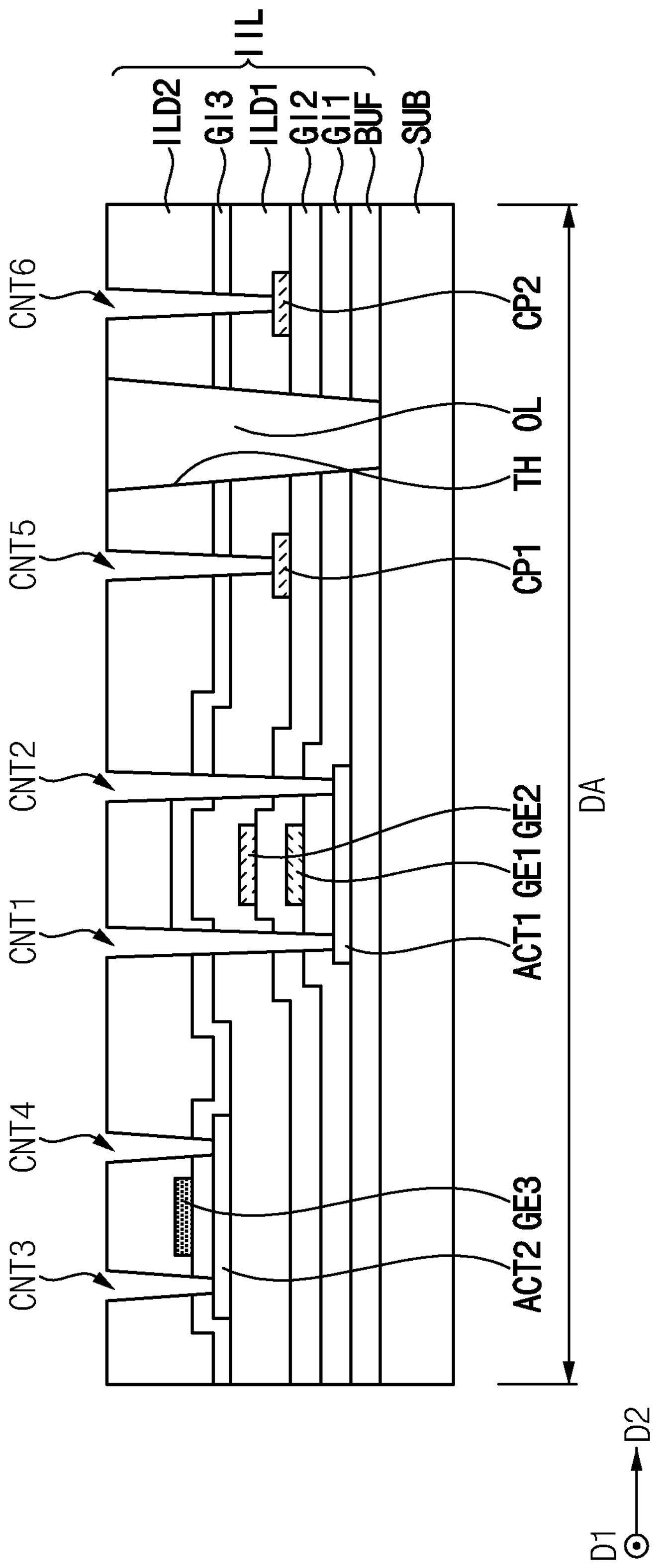

Referring to FIG. 18, a third contact hole CNT3 exposing a portion (i.e., the source region) of an upper surface of the second active pattern ACT2 may be formed by etching a first portion of the third gate insulating layer GI3 and the second interlayer insulating layer ILD2. In addition, a fourth contact hole CNT4 exposing a portion of an upper surface (i.e., the drain region) of the second active pattern ACT2 by etching a second portion of the third gate insulating layer GI3 and the second interlayer insulating layer ILD2 may be formed.

Figure 19:
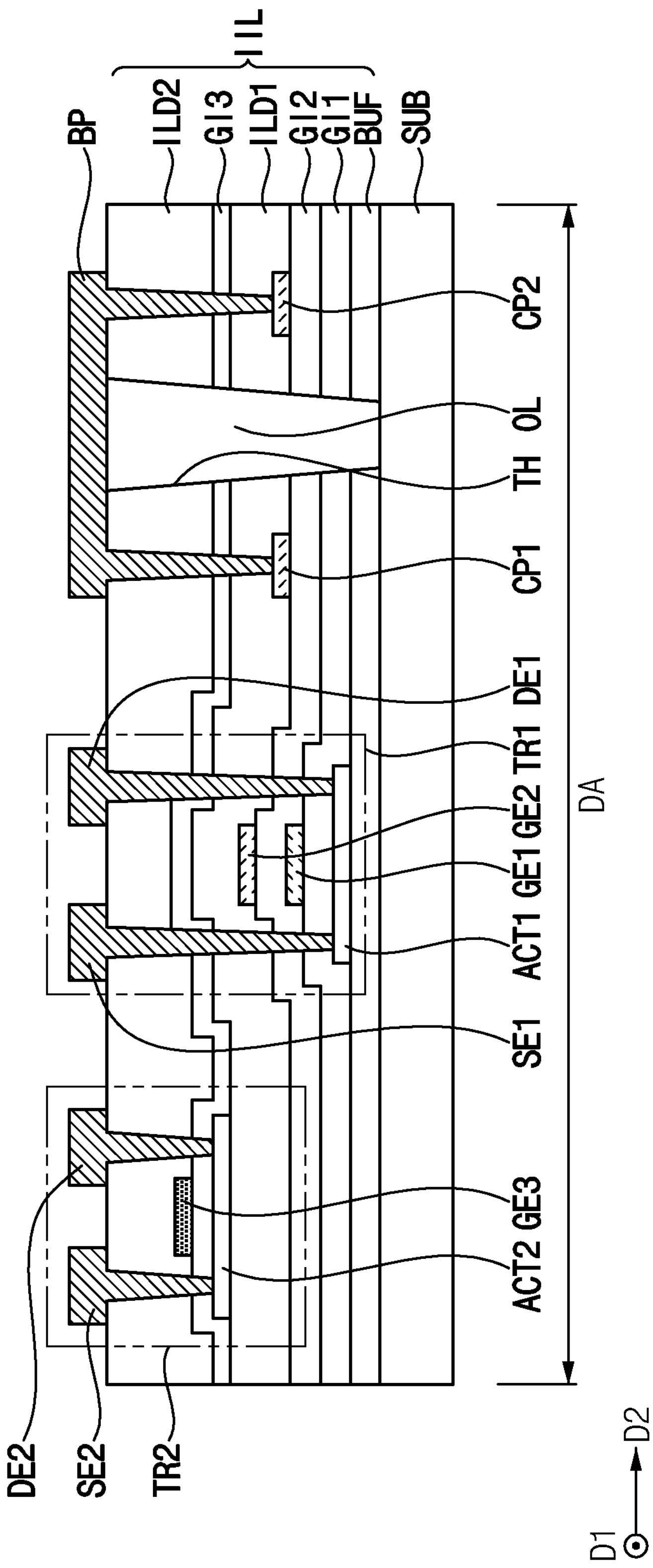

Referring to FIG. 19, a fifth contact hole CNT5 exposing a portion of an upper surface of the first conductive pattern CP1 may be formed by etching a first portion of the first interlayer insulating layer ILD1, the third gate insulating layer GI3, and the second interlayer insulating layer ILD2 in the non-pixel area NPXA (not shown in FIG. 19). A six contact hole CNT6 exposing a portion of an upper surface of the second conductive pattern CP2 may be formed by etching a second portion of the first interlayer insulating layer ILD1, the third gate insulating layer GI3, and the second interlayer insulating layer ILD2 in the non-pixel area NPXA (not shown in FIG. 19).

Then, a metal film may be formed on the inorganic insulating layer IIL to fill the first contact hole CNT1, the second contact hole CNT2, the third contact hole CNT3, the fourth contact hole CNT4, the fifth contact hole CNT5, and the sixth contact hole CNT6. By etching the metal film, the first source electrode SE1 and the first drain electrode DE1 respectively connected to the first active pattern ACT1, the second source electrode SE2 and the second drain electrode DE2 respectively connected to the second active pattern ACT2, and the bridge pattern BP respectively connected to the first and second connection patterns CP1 and CP2 may be formed. For example, the metal layer may be formed using a metal, a conductive metal oxide, and the like.

Figure 20:
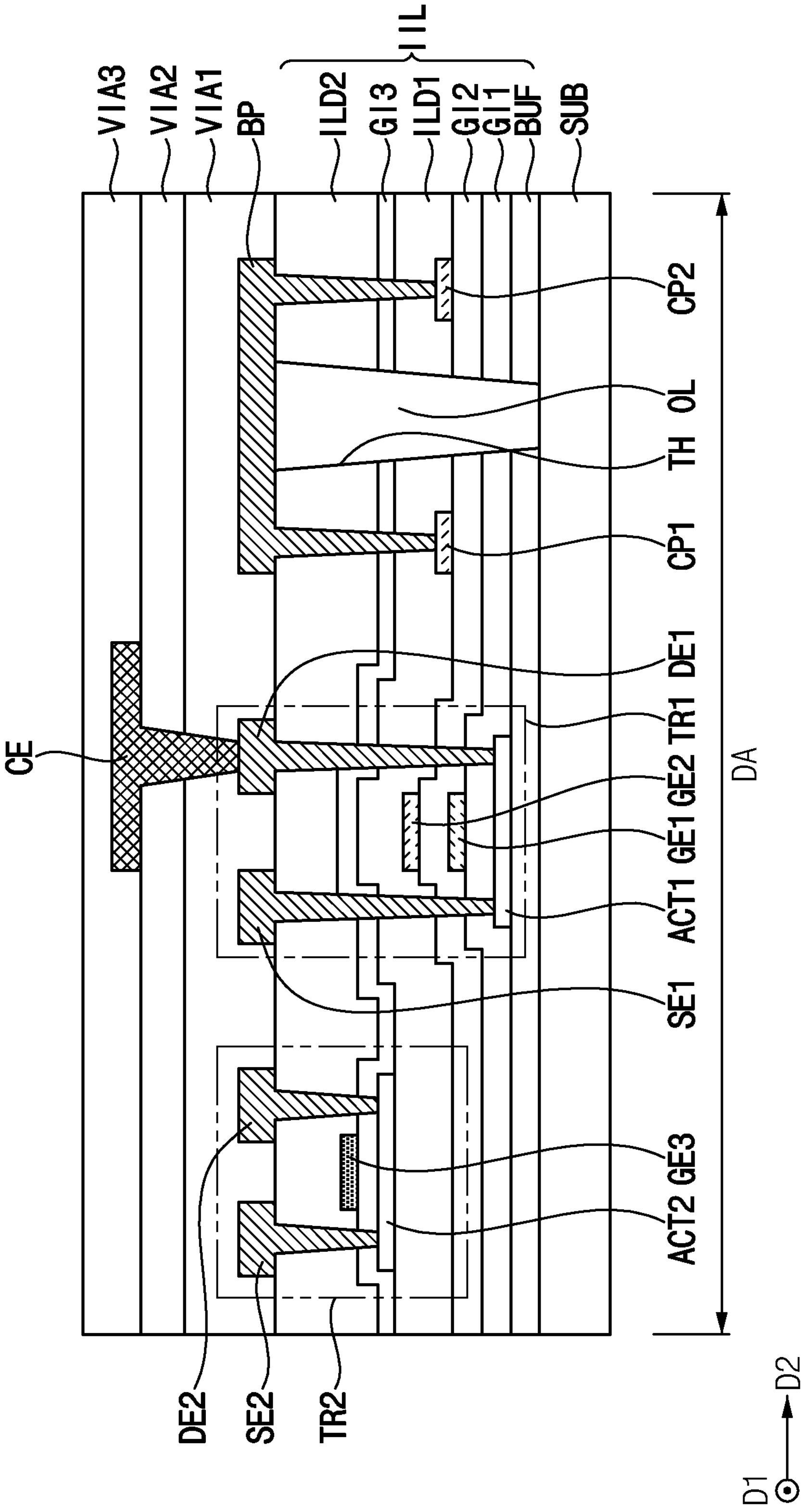

Referring to FIG. 20, the first via insulating layer VIA1, the second via insulating layer VIA2, the connection electrode CE, and the third via insulating layer VIA3 may be sequentially formed on the second interlayer insulation layer ILD2. For example, each of the first, second, and third via insulating layers VIA1, VIA2, and VIA3 may be formed using an organic material. For example, the connection electrode CE may be formed using metal, conductive metal oxide, and the like.

Referring back to FIG. 6, the pixel electrode PE may be formed on the third via insulating layer VIA3. The pixel electrode PE may be connected to the connection electrode CE. The pixel defining layer PDL may be formed on the third via insulating layer VIA3. The pixel defining layer PDL may cover both sides of the pixel electrode PE. The light emitting layer EML may be formed on the pixel electrode PE. The common electrode CME may be formed on the pixel defining layer PDL and the light emitting layer EML. The encapsulation layer ENC may be formed on the common electrode CME.

Accordingly, the display panel DP of the display device DD illustrated in FIG. 6 may be manufactured.

Figure 21:
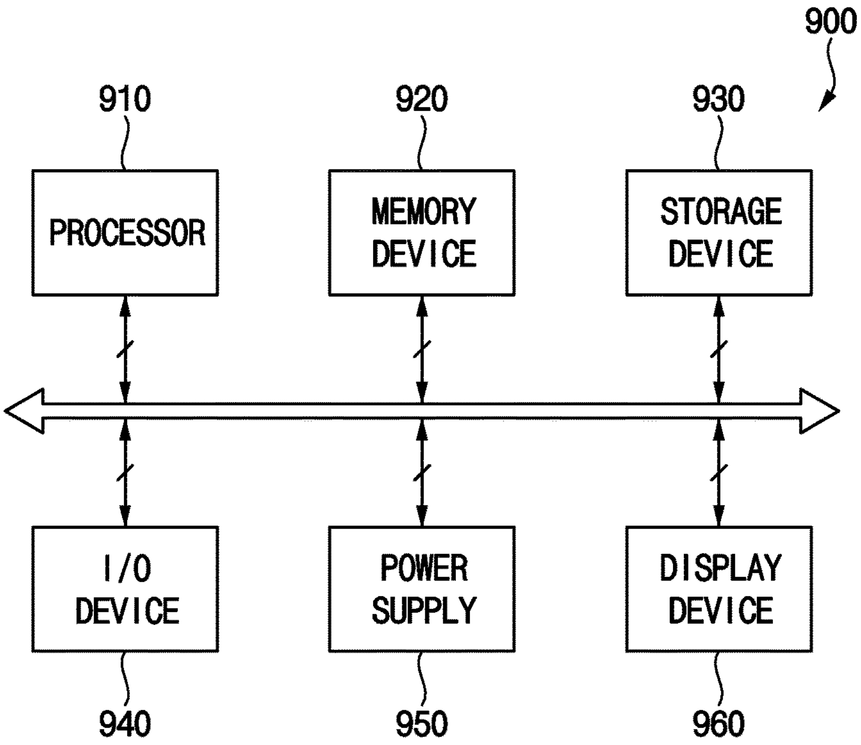
FIG. 21 is a block diagram illustrating an electronic device including the display device of FIG. 1.
Figure 22:
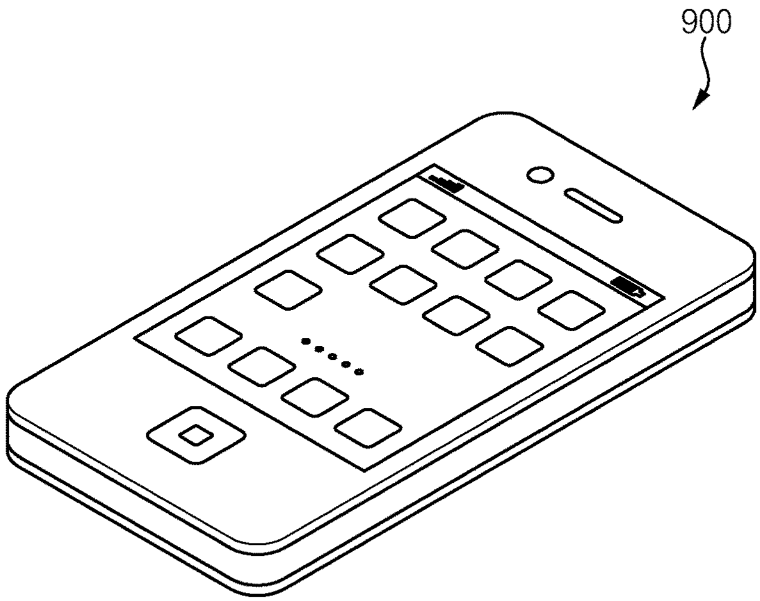
FIG. 22 is a diagram illustrating an example in which the electronic device of FIG. 21 is implemented as a smart phone.

FIG. 21 is a block diagram illustrating an electronic device including the display device of FIG. 1. FIG. 22 is a diagram illustrating an example in which the electronic device of FIG. 21 is implemented as a smart phone.

Referring to FIGS. 21 and 22, in an embodiment, the electronic device 900 may include a processor 910, a memory device 920, a storage device 930, an input/output ("I/O") device 940, a power supply 950 and a display device 960. In this case, the display device 960 may correspond to the display device DD described with reference to FIGS. 1, 2, 3, 4, 5, and 6. The electronic device 900 may further include various ports capable of communicating with a video card, a sound card, a memory card, a USB device, and the like.

In an embodiment, as illustrated in FIG. 22, the electronic device 900 may be implemented as a smart phone. However, embodiments are not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a substrate including a pixel area and a non-pixel area adjacent to the pixel area;

an inorganic insulating layer disposed on the substrate;

a through hole defined in the inorganic insulating layer and disposed in the non-pixel area;

a light emitting element disposed in the pixel area on the inorganic insulating layer;

an organic layer filing the through hole and having an upper surface positioned at substantially a same level as an upper surface of the inorganic insulating layer based on a surface of the substrate;

a first conductive pattern disposed in the non-pixel area on the substrate;

a second conductive pattern disposed on a same layer as the first conductive pattern; and a bridge pattern disposed on the organic layer and connecting the first conductive pattern and the second conductive pattern.

2. The display device of claim 1, wherein the through hole exposes at least a portion of an upper surface of the substrate.

3. The display device of claim 1, further comprising:

a driving transistor disposed in the pixel area on the substrate; and a switching transistor disposed in the pixel area on the substrate and including a semiconductor material different from a semiconductor material include in the driving transistor.

4. The display device of claim 3, wherein the driving transistor includes:

a first active pattern disposed on the substrate and having amorphous silicon or polycrystalline silicon.

5. The display device of claim 4, wherein the switching transistor includes:

a second active pattern disposed on the substrate and having a metal oxide semiconductor.

6. The display device of claim 5, wherein the second active pattern is disposed on a layer different from a layer of the first active pattern.

7. The display device of claim 3, wherein the through hole is adjacent to the driving transistor.

8. The display device of claim 1, wherein the pixel area and the non-pixel area constitute a display area, and the display area includes a foldable area having flexibility and a non-folding area adjacent to at least one side of the foldable area.

9. A method of manufacturing a display device, the method comprising steps of:

forming an inorganic insulating layer disposed on a substrate including a pixel area and a non-pixel area adjacent to the pixel area;

forming a photoresist layer disposed on the inorganic insulating layer;

simultaneously forming first and second grooves exposing an upper surface of the photoresist layer in the pixel area and an opening exposing an upper surface of the inorganic insulating layer in the non-pixel area by exposing the photoresist layer;

forming a through hole overlapping the non-pixel area by etching the inorganic insulating layer corresponding to the opening;

forming an organic film disposed on an entire surface of the photoresist layer to fill the first groove, the second groove, the opening, and the through hole; and forming a light emitting element in the pixel area disposed on the inorganic insulating layer.

10. The method of claim 9, wherein the simultaneously forming the first groove, the second groove, and the opening is accomplished by:

placing a mask having a light transmission portion, a semi-transmission portion, and a light blocking portion on the photoresist layer, forming the opening by removing all of the photoresist layer corresponding to the light transmission portion, and forming the first groove and the second groove by removing a portion of the photoresist layer corresponding to the semi-transmission portion.

11. The method of claim 10, wherein the mask includes a halftone mask, a slit mask, or a phase shift mask.

12. The method of claim 10, wherein the light transmission portion transmits all light, the semi-transmission portion transmits some light, and the light blocking portion blocks all light.

13. The method of claim 9, further comprising steps of, after the forming the organic film:

forming a preliminary organic layer filling the through hole by etching an entire surface of the organic layer; and exposing an upper surface of the inorganic insulating layer corresponding to the first groove and the second groove by etching an entire surface of the photoresist layer.

14. The method of claim 13, wherein the exposing the upper surface of the inorganic insulating layer corresponding to the first groove and the second groove is accomplished by:

forming an organic layer filling the through hole and having an upper surface positioned at substantially a same level as an upper surface of the inorganic insulating layer based on a surface of the substrate by etching the preliminary organic layer.

15. The method of claim 13, further comprising steps of, after the exposing the upper surface of the inorganic insulating layer corresponding to the first groove and the second groove:

forming a first contact hole and a second contact hole by etching a portion of the inorganic insulating layer corresponding to the first groove and the second groove, respectively; and removing the photoresist layer.

16. The method of claim 15, further comprising a step of, before the forming the inorganic insulating layer:

forming an active pattern including amorphous silicon or polycrystalline silicon in the pixel area on the substrate, wherein each of the first contact hole and the second contact hole exposes an upper surface of the active pattern.

17. The method of claim 15, wherein the through hole is formed through a process different from a process of the first contact hole and the second contact hole.

18. The method of claim 9, wherein the photoresist layer is formed using a positive photoresist.

19. An electronic device comprising:

a display device; and a power supply that provides power to the display device, wherein the display device includes:

a substrate including a pixel area and a non-pixel area adjacent to the pixel area;

an inorganic insulating layer disposed on the substrate;

a through hole defined in the inorganic insulating layer and disposed in the non-pixel area;

a light emitting element disposed in the pixel area on the inorganic insulating layer;

an organic layer filing the through hole and having an upper surface positioned at substantially a same level as an upper surface of the inorganic insulating layer based on a surface of the substrate;

a first conductive pattern disposed in the non-pixel area on the substrate;

a second conductive pattern disposed on a same layer as the first conductive pattern; and a bridge pattern disposed on the organic layer and connecting the first conductive pattern and the second conductive pattern.

* * * * *